United States Patent
Jang et al.

(10) Patent No.: US 12,027,971 B2
(45) Date of Patent: Jul. 2, 2024

(54) DISPLAY APPARATUS WITH SWITCHED MODE POWER SUPPLY TO ADJUST FREQUENCY OF CONTROL SIGNAL

(71) Applicants: SAMSUNG ELECTRONICS CO., LTD., Suwon-si (KR); KOOKMIN UNIVERSITY INDUSTRY ACADEMY COOPERATION FOUNDATION, Seoul (KR)

(72) Inventors: Duhee Jang, Suwon-si (KR); Sangkyoo Han, Seoul (KR); Jeongil Kang, Suwon-si (KR); Hyosoon Choi, Suwon-si (KR); Kasan Ha, Suwon-si (KR)

(73) Assignees: Samsung Electronics Co., Ltd., Suwon-si (KR); Kookmin University Industry Academy Cooperation Foundation, Seoul (KR)

( * ) Notice: Subject to any disclaimer, the term of this patent is extended or adjusted under 35 U.S.C. 154(b) by 0 days.

(21) Appl. No.: 17/588,601

(22) Filed: Jan. 31, 2022

(65) Prior Publication Data
US 2022/0158548 A1 May 19, 2022

Related U.S. Application Data

(63) Continuation of application No. PCT/KR2020/009955, filed on Jul. 28, 2020.

(30) Foreign Application Priority Data

Aug. 2, 2019 (KR) .......... 10-2019-0094268

(51) Int. Cl.
*G09G 3/00* (2006.01)
*G09G 3/20* (2006.01)
(Continued)

(52) U.S. Cl.
CPC ............ *H02M 1/4225* (2013.01); *G09G 3/20* (2013.01); *H02M 3/33507* (2013.01); *G09G 2330/021* (2013.01); *G09G 2330/06* (2013.01)

(58) Field of Classification Search
CPC ............ H02M 1/4225; H02M 3/33507; G09G 2330/021; G09G 2330/06; G09G 3/20
See application file for complete search history.

(56) References Cited

U.S. PATENT DOCUMENTS

| 2012/0218243 A1* | 8/2012 | Ger .......... G09G 3/20 345/211 |
| 2013/0265340 A1* | 10/2013 | Ahn .......... G09G 5/02 345/212 |

(Continued)

FOREIGN PATENT DOCUMENTS

| CN | 103078489 | 5/2013 |
| JP | 2015-173524 | 10/2015 |

(Continued)

OTHER PUBLICATIONS

International Search Report for PCT/KR2020/009955 dated Nov. 26, 2020, 4 pages.
(Continued)

*Primary Examiner* — Roy P Rabindranath
(74) *Attorney, Agent, or Firm* — Nixon & Vanderhye P.C.

(57) ABSTRACT

Disclosed is a display apparatus including: a display; a transformer configured to boost an input alternating current (AC) first voltage and output a second voltage; a switch configured to allow an electric current to flow or stop in the transformer based on a control signal; a power factor correction (PFC) converter configured to correct a power factor of the output second voltage, and output a direct current (DC) third voltage to the display; and a controller configured to modulate a frequency of the control signal so that the second voltage has a target level, and increase or decrease the frequency of the control signal within a specified range to synchronize with an AC period of the first voltage.

14 Claims, 22 Drawing Sheets

(51) Int. Cl.
    *H02M 1/42*           (2007.01)
    *H02M 3/335*       (2006.01)

(56)                  References Cited

U.S. PATENT DOCUMENTS

2015/0154917 A1\*   6/2015   Jung .................... G09G 3/342
                                                                            345/102
2018/0254710 A1     9/2018   Wang et al.

FOREIGN PATENT DOCUMENTS

| | | |
|---|---|---|
| JP | 2016-208682 | 12/2016 |
| KR | 10-2013-0072175 A | 7/2013 |
| KR | 10-2013-0113220 A | 10/2013 |
| KR | 10-2013-0116234 | 10/2013 |
| WO | 2012/035474 | 3/2012 |

OTHER PUBLICATIONS

Korean Office Action dated Mar. 18, 2024 for KR Application No. 10-2019-0094268.

\* cited by examiner

HIGH VOLTAGE MODE

LOW VOLTAGE PWM MODE (DUTY CONTROL TYPE)

LOW VOLTAGE PWM MODE (PHASE SHIFT TYPE)

LOW VOLTAGE PFM MODE

DISPLAY APPARATUS WITH SWITCHED MODE POWER SUPPLY TO ADJUST FREQUENCY OF CONTROL SIGNAL

CROSS-REFERENCE TO RELATED APPLICATIONS

This application is a continuation of International Application No. PCT/KR2020/009955 designating the United States, filed on Jul. 28, 2020, in the Korean Intellectual Property Receiving Office and claiming priority to Korean Patent Application No. 10-2019-0094268, filed on Aug. 2, 2019, in the Korean Intellectual Property Office, the disclosures of which are incorporated by reference herein in their entireties.

BACKGROUND

Field

The disclosure relates to a display apparatus, and for example, to a display apparatus including a switched mode power supply (SMPS).

Description of Related Art

A switched mode power supply (SMPS) provided in a television (TV) or the like display apparatus needs to be designed to satisfy power-factor and harmonic regulations for stable operation.

Further, electromagnetic interference (EMI) is one of important issues in designing the switched mode power supply, and a method of achieving improvement in the EMI includes a jittering method based on change in a switching frequency.

However, when a resonant converter that operates in a pulse frequency modulation (PFM) mode is employed in the power supply, only a typical jittering method of simply changing the switching frequency is not enough to achieve the improvement in the EMI.

In addition, when an alternating current (AC)/AC converter that outputs an AC voltage is employed, the output voltage may be distorted without maintaining a normal waveform of the AC voltage while the switching frequency is changed.

SUMMARY

Embodiments of the disclosure address the above problems and provide a display apparatus, which includes a switched mode power supply to perform jittering synchronized with an input AC voltage, thereby having an effect on improvement in electromagnetic interference (EMI) while ensuring stability of an output voltage.

According to an example embodiment of the disclosure, a display apparatus is provided, the display apparatus including: a display; a transformer configured to boost an input alternating current (AC) first voltage and output a second voltage; a switch configured to allow an electric current to flow or stop in the transformer based on a control signal; a power factor correction (PFC) converter configured to correct a power factor of the output second voltage, and output a direct current (DC) third voltage to the display; and a controller configured to modulate a frequency of the control signal so that the second voltage can have a target level, and increase or decrease the frequency of the control signal within a specified range to synchronize with an AC period of the first voltage.

The controller may be configured to: divide the AC period of the first voltage into a plurality of sections in specified units, and increase or decrease the frequency of the control signal for each of the divided sections.

The controller may be configured to increase or decrease the frequency of the control signal based on phases for each of the divided sections.

The controller may be configured to adjust a voltage of the control signal to correspond to increase or decrease of the frequency.

The controller may be configured to control the control signal, of which the voltage is adjusted, to have a constant average voltage during the AC period.

The controller may be configured to: identify a frequency of the first voltage, and identify a range, within which the frequency is increased or decreased, based on the identified frequency.

The controller may be configured to identify the AC period of the first voltage corresponding to a section from a point at which a highest voltage level of the first voltage is first identified to a point at which a highest voltage level is next identified.

The controller may be configured to: detect a voltage level at specified time intervals for two periods of the first voltage, and identify a rising period and a falling period of the first voltage based on results of the detection; and identify the highest voltage level based on a point at which the rising period is switched over to the falling period.

The controller may be configured to: calculate a first average level between a first detected level and a second detected level, and calculate a second average level between the second detected level and a third detected level, among the plurality of detected levels; and identify a rising period and a falling period of the first voltage based on comparison between the first average level and the second average level.

The controller may be configured to: identify the frequency of the input AC first voltage, and identify a range, within which the frequency of the control signal is increased or decreased, based on the identified frequency.

The controller may be configured to: adjust the range, within which the identified frequency of the control signal is increased or decreased, based on the level of the first voltage less than a specified reference level.

The display apparatus may further include: a first rectifier configured to rectify a voltage received from an outside and output the AC first voltage; and a second rectifier configured to rectify the second voltage boosted from the first voltage, wherein the controller may be configured to: detect the rectified second voltage, and modulate the frequency of the control signal so that the second voltage can have a target level, based on results of the detection.

The switch may include: first, second, third and fourth switching devices and, based on the first, second, third and fourth switching devices being selectively turned on or off, the switch may be configured to: correspond to one of a full bridge type or a half bridge type to receive a control signal, the frequency of which is increased or decreased within a specified range, from the controller.

The controller may be configured to: turn on the second switching device and turn off the fourth switching device based on the input AC first voltage being greater than or equal to a specified first reference voltage, and output the control signal, the frequency of which is increased or decreased, to the first and third switching devices.

The controller may be configured to output the control signal, the frequency of which is increased or decreased, to the first, second, third and/or fourth switching devices, based on the input AC first voltage being less than the specified first reference voltage.

The transformer may employ an LLC resonant converter.

As described above, a display apparatus according to various example embodiments of the disclosure performs jittering synchronized with an input AC voltage, thereby having an effect on improvement in EMI while ensuring stability of an output voltage.

Further, the display apparatus according to various example embodiments of the disclosure is applicable to various areas and has an increased effect on improvement in the EMI because it can operate with input AC voltage of various levels, a switching frequency is increased or decreased within a range set corresponding to the input AC voltage, and the increasing or decreasing range is adjustable.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
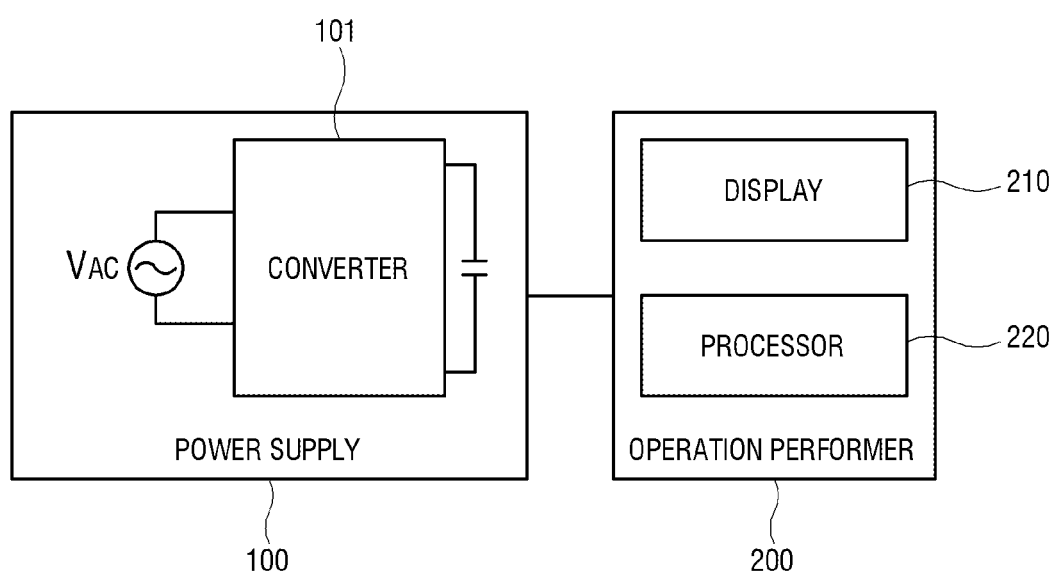
FIG. 1 is a block diagram illustrating an example configuration of a display apparatus according to various embodiments.

Below, various example embodiments will be described in greater detail with reference to accompanying drawings. In the drawings, like numerals or symbols refer to like elements having substantially the same function, and the size of each element may be exaggerated for clarity and convenience of description. However, the configurations and functions illustrated in the following example embodiments are not construed as limiting the present disclosure and the key configurations and functions. In the following descriptions, details about publicly known functions or features may be omitted if it is determined that they may cloud the gist of the disclosure.

In the following example embodiments, terms 'first', 'second', etc. are simply used to distinguish one element from another, and singular forms are intended to include plural forms unless otherwise mentioned contextually. In the following example embodiments, it will be understood that terms 'comprise', 'include', 'have', etc. do not preclude the presence or addition of one or more other features, numbers, steps, operation, elements, components or combination thereof. In addition, a 'module' or a 'portion' may perform at least one function or operation, be achieved by hardware, software or combination of hardware and software, and be integrated into at least one module. In the disclosure, at least one among a plurality of elements refers to not only all the plurality of elements but also both each one of the plurality of elements excluding the other elements and a combination thereof.

FIG. 1 is a block diagram illustrating an example configuration of a display apparatus according to various embodiments.

A display apparatus 10 according to an embodiment of the disclosure, as shown in FIG. 1, includes a power supply 100 for supplying power, and an operation performer (comprising various circuitry) 200 (hereinafter, also referred to as an 'operator') for performing operations with the power received from the power supply 100.

The operation performer 200 may include various circuitry and consumes power to perform predetermined (e.g., specified) functions.

The operation performer 200 may include electronic devices, for example, a display 210, a processor (e.g., including processing circuitry) 220, etc., which serve as elements for performing the operations of the display apparatus 10. FIG. 1 shows that the operation performer 200 includes the display 210 and the processor 220 by way of example, but there are no limits to the kind of electronic devices in the disclosure. In other words, various elements provided as a load that consumes power in the display apparatus 10 may be included in the operation performer 200.

The power supply 100 receives commercial power, e.g., alternating current (AC) voltage through an electric outlet installed in a wall of a home, an office, etc.

According to an embodiment, the power supply 100 may be embodied by a switched mode power supply (SMPS) that includes a switching device to perform on/off switching operations.

The power supply 100, as shown in FIG. 1, includes a converter 101 including various circuitry that converts an input AC voltage into an operating voltage to be supplied to the operation performer 200.

According to an embodiment, the converter 101 may be embodied by an AC/direct current (DC) converter that converts the input AC voltage into a DC voltage.

According to an embodiment, the converter 101 may be embodied by an AC/AC converter that boosts and outputs the input AC voltage.

However, there are no limits to the type and configuration of the converter 101 according to the disclosure, and the converter 101 according to the disclosure may be variously embodied besides the AC/DC converter or the AC/AC converter or may further include another element.

When the converter 101 is the AC/AC converter, the power supply 100 may further include a separate AC/DC converter for converting AC voltage output from the converter 101 into DC voltage. The AC/DC converter may, for example, be embodied by a power factor correction (PFC) converter that corrects a power factor of AC voltage output from the AC/AC converter and outputs DC voltage.

In this case, the AC/AC converter, given by way of example, may be provided in an independent power supply connectable to the main body by a cable or the like, e.g., an adapter, as an element separable from the main body of the display apparatus 10 including the operation performer 200. Therefore, the AC voltage boosted by the AC/AC converter provided in the adapter is transferred to the AC/DC converter provided in the main body through the cable and converted into a DC voltage having a predetermined level in the AC/DC converter, thereby being supplied to the operation performer 200.

In the display apparatus 10, the adapter may be provided inside an electronic apparatus connectable to the main body of the display apparatus 10 and outputting a signal to the main body. The electronic apparatus may refer, for example, to a media box as an appended or auxiliary device capable of outputting a signal corresponding to an image to be displayed on the display 210.

According to an embodiment, the electronic apparatus may also refer to a one connect (OC) box in terms of an apparatus connected to the main body of the display apparatus 10 by a single cable capable of transmitting an audio/video signal and power. However, a connection method between the electronic apparatus and the main body of the display apparatus according to the disclosure is not limited to the cable, but may include various wired/wireless interfaces.

According to an embodiment, the display apparatus 10 may be embodied by a television (TV) that processes a broadcast image based on at least one of a broadcast signal, broadcast information or broadcast data received from a transmitter of a broadcasting station.

However, the display apparatus 10 according to the disclosure is not limited to the TV, but may include any apparatus that operates with power received through the power supply 100 including the converter 101. In other words, the display apparatus 10 may include, for example and without limitation, a computer system including a personal computer such as a laptop computer or a desktop computer, a monitor connected to a computer main body, etc., various electronic devices, and the like various apparatuses.

When the display apparatus 10 is the TV, the display apparatus 10 may receive broadcast content based on at least one of a broadcast signal, broadcast information or broadcast data received from the transmitter of the broadcasting station directly or through the electronic apparatus.

The display apparatus 10 may wirelessly receive a radio frequency (RF) signal, e.g., a broadcast signal transmitted from the broadcasting station. To this end, the main body of the display apparatus 10 or the electronic apparatus may include an antenna for receiving a broadcast signal and a tuner for being tuned to a channel corresponding to the broadcast signal.

The broadcast signal is receivable through a terrestrial wave, a cable, a satellite, etc., and a signal source is not limited to the broadcasting station. In other words, an image source according to the disclosure may include any apparatus or station capable of transmitting/receiving data.

A signal received in the display apparatus 10 may have various standards according to the embodiments of the apparatuses. For example, image content may be wirelessly received through high definition multimedia interface (HDMI), composite video, component video, super video, syndicat des constructeurs d'appareils radiorécepteurs et téléviseurs (SCART), a universal serial bus (USB), etc.

The display apparatus 10 may receive content from various external apparatuses including a server through wired or wireless network communication, and there are no limits to the kinds of communication.

For example, the display apparatus 10 may perform at least one of wireless communication using an access point (AP) or wireless communication for direct connection with other devices without using the AP. For example, the display apparatus 10 may receive content from the image source through wireless network communication such as Wi-Fi, Wi-Fi direct, or Bluetooth. Further, the display apparatus 10 may receive content through wired network communication such as Ethernet, etc.

The display apparatus 10 may process content received by various methods as described above, so that the display 210 can output, e.g., display an image based on the content.

According to an embodiment, the display apparatus 10 may operate as a smart TV or an Internet protocol (IP) TV. The smart TV may refer, for example, to a TV that can receive and display a broadcast signal in real time, have a web browsing function to search and consume various pieces of content through the Internet while displaying the broadcast signal in real time, and provide a convenient user environment for this end. Further, the smart TV can provide an interactive service to a user because it includes an open software platform. Therefore, the smart TV can provide various pieces of content, for example, an application for a predetermined service to a user through the open software platform. Such an application refers to an application program for various kinds of services, for example, applications for social network service (SNS), finance, news, weather, map, music, movie, game, electronic book, and the like services.

The display 210 displays an image based on content received through the display apparatus 10 itself or the electronic apparatus, or stored in an internal or external storage. According to an embodiment, the display 210 may include a panel for a screen on which an image is displayed.

The display 210 may for example be embodied by various display types such as, for example, and without limitation, liquid crystal, plasma, light-emitting diode, organic light-emitting diode, surface-conduction electron-emitter, carbon nano-tube, nano-crystal, etc.

The processor 220 may include various processing circuitry and is provided to generally control the display apparatus 10. The processor 220 may be embodied by at least one general-purpose processor that loads at least a part of a control program from a volatile memory, in which the control program is installed, and executes the loaded control program, for example, a central processing unit (CPU), an application processor (AP), or a microprocessor.

Below, in the display apparatus according to an embodiment of the disclosure, detailed elements of the power supply will be described in greater detail below with reference to the accompanying drawings.

Figure 2:
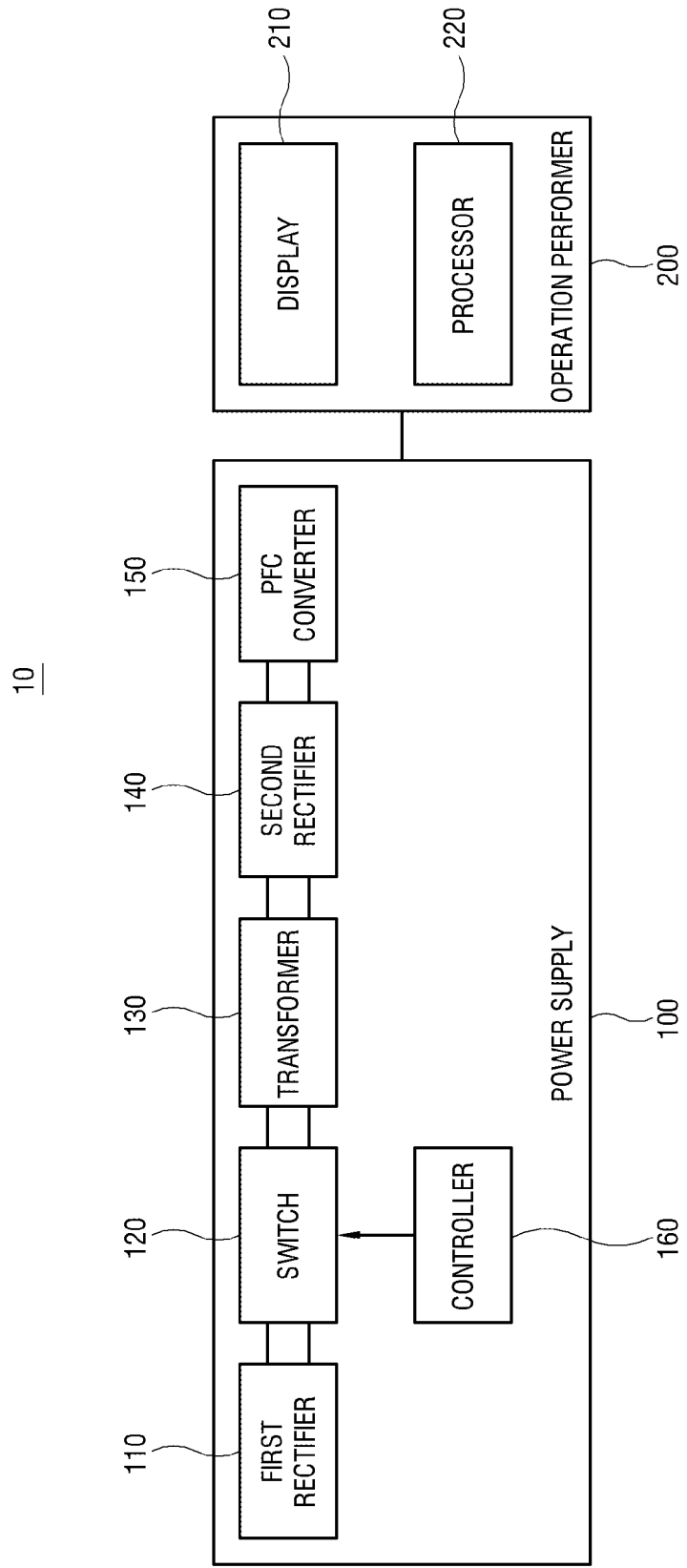
FIG. 2 is a block diagram illustrating an example configuration of a power supply in a display apparatus according to various embodiments.

FIG. 2 is a block diagram illustrating an example configuration of a power supply in a display apparatus according to various embodiments.

In the display apparatus 10 according to an embodiment of the disclosure, the power supply 100, as shown in FIG. 2, includes a first rectifier 110 to rectify an input AC first voltage, a switch 120 to perform switching based on an operating frequency, a transformer 130 to boost and output the AC first voltage by transmitting the AC first voltage from a primary side to a secondary side based on operation of the switch 120, a second rectifier 140 to rectify a second voltage output from the transformer 130, a PFC converter 150 to correct the power factor of the second voltage output from the second rectifier 140 and output a DC third voltage, and a controller (e.g., including various processing circuitry) 160 to control the switch 120 so that the second voltage boosted by the transformer 130 can be output.

The third voltage converted into the DC voltage in the PFC converter 150 is supplied as operating voltage to the elements of the display apparatus 10, for example, the display 210, the processor 220 and the like operation performer 200.

Below, more detailed operations of the power supply will be described with reference to the drawings.

Figure 3:
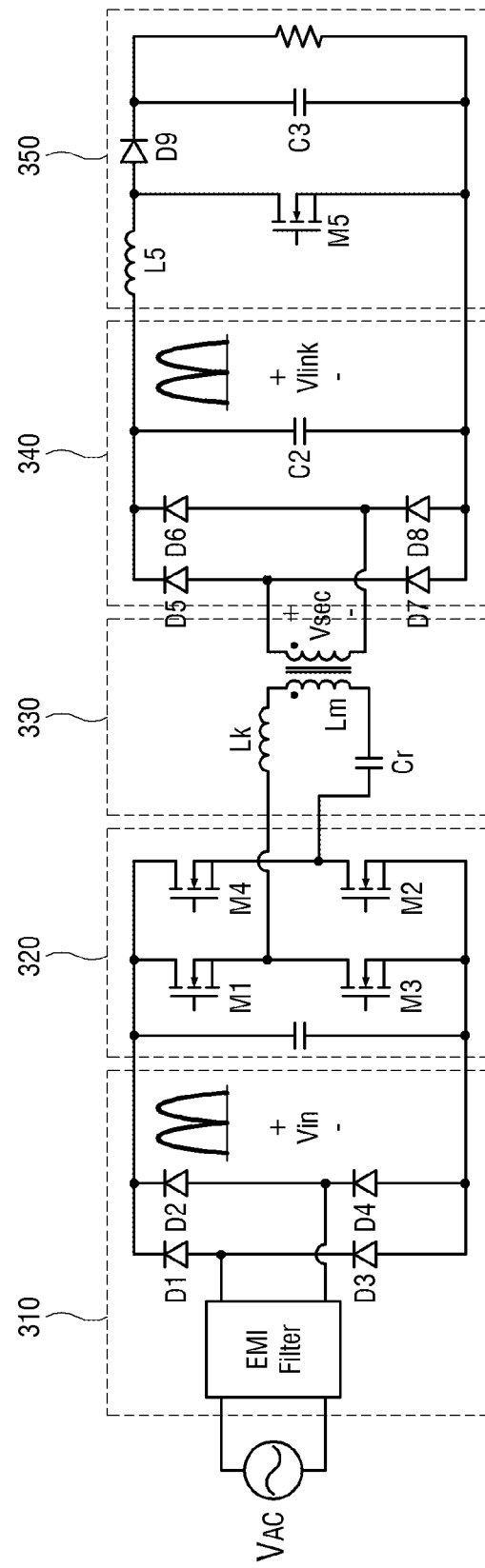
FIG. 3 is a circuit diagram illustrating an example configuration of a power supply in a display apparatus according to various embodiments.

FIG. 3 is a circuit diagram illustrating an example configuration of a power supply in a display apparatus according to various embodiments.

A first rectifier 310, a switch 320, a transformer 330, a second rectifier 340 and a PFC converter 350 shown in FIG. 3 are embodied by way of example on an electrical circuit as the first rectifier 110, the switch 120, the transformer 130, the second rectifier 140 and the PFC converter 150 shown in FIG. 2, and the electrical circuit for the first rectifier 110, the switch 120, the transformer 130, the second rectifier 140 and the PFC converter 150 is not limited to that shown in FIG. 3. Although it is not shown in FIG. 3, the power supply 100 may further include a controller (e.g., including processing circuitry) 360 (see FIG. 6) to output a control signal (e.g., a driving signal) to the switch 320, which is equivalent to the controller 160 of FIG. 2. In this way, the elements referred to by the same names perform the same or similar operations, and thus repetitive descriptions may be avoided.

According to an embodiment, the circuit shown in FIG. 3 may be distributed between the main body of the display apparatus 10 and the adapter connectable to the main body by the cable or the like. Further, the adapter may be provided in the electronic apparatus capable of outputting a signal to the display apparatus 10.

The first rectifier 310 may for example receive commercial voltage, e.g., an AC voltage as an input voltage, which is input through the electric outlet installed in the wall, etc. The first rectifier 310 may receive input AC line voltages of, for example, 90V~264V.

The first rectifier 310 rectifies a first AC voltage $V_{in}$ (input line voltage) having a line voltage form, e.g., a first AC voltage. According to the disclosure, the first AC voltage is for example universal line 90~264 $V_{rms}$.

According to an embodiment, the first rectifier 310 may, as shown in FIG. 3, include an electromagnetic interference (EMI) filter for removing noise from the input first AC voltage, and a bridge diode circuit including a plurality of diodes D1, D2, D3 and D4 for full-wave rectifying the input voltage.

The first AC voltage $V_{in}$ rectified in the first rectifier 310 is for example an AC line voltage of 60 Hz.

The switch 320 includes a switching device for switching an electric current flowing in the transformer 330. The switch 320 may include a plurality of switching devices, for example, first to fourth switching devices M1, M2, M3 and M4 as shown in FIG. 3. However, the embodiment of the switch 120 is not limited to that shown in FIG. 3, and the switch 120 may for example be embodied as a half-bridge type using two switching devices.

The switching devices M1, M2, M3 and M4 may perform switching operation based on a signal output from the controller 360 (see FIG. 6), and the switching operation causes power from the primary side of the transformer 130 to the secondary side.

According to an embodiment, the switching devices M1, M2, M3 and M4 may perform fast switching so that a high frequency pulse (e.g., a high frequency switched transformer voltage) $V_{sec}$ generated from the first AC voltage $V_{in}$ can be applied to the transformer 330, thereby electrically insulating the input and the output of the transformer 330 from each other. In the power supply 100 of the display apparatus 10 according to an embodiment of the disclosure, the transformer 330 may be embodied by a small lightweight high-frequency transformer to which the high frequency pulse $V_{sec}$ is applied.

According to an embodiment, the transformer 330 may, as shown in FIG. 3, employ an LLC resonant converter that includes a resonant inductor $L_k$, a magnetizing inductor $L_m$ of the transformer, and a resonant capacitor $C_r$.

However, in the display apparatus 10 according to the disclosure, there are no limits to the embodiment of the transformer 330, and the transformer 330 may be embodied using one of various converters.

The second rectifier 340 rectifies the high frequency pulse $V_{sec}$ generated as above by the transformer 330, and outputs an AC second voltage $V_{link}$ (e.g., a second AC voltage).

The second rectifier 340 may, as shown in FIG. 3, include a plurality of diodes D5, D6, D7 and D8 and a capacitor C2, and output the second AC voltage $V_{link}$ of a rectified sine wave. According to an embodiment, the second rectifier 340 may output a voltage having a sine wave of 120 Hz.

The PFC converter 350 corrects the power factor of the second AC voltage output from the second rectifier 340, and converts the second AC voltage into a DC voltage having a predetermined (e.g., specified) level. The PFC converter 350 may correct the power factor of the second AC voltage by decreasing reactive power and increasing active power, by matching the phases of the voltages/currents, etc.

According to an embodiment, the PFC converter 350 may, for example, as shown in FIG. 3, be designed as a switched mode PFC AC/DC converter, which includes a switching device M5 to be turned on or off at a predetermined (e.g., specified) rate in response to a PWM control signal, but there are no limits to the embodiment of the PFC converter 350.

When the switching device M5 is turned on, electric current flows in an inductor L5 and the switching device M5, and power is stored in the inductor L5. On the other hand, when the switching device M5 is turned off, electric current flows in the inductor L5 through the diode D9 and a capacitor C3, and the power stored in the inductor L5 is transferred to the capacitor C3. The power transferred to the capacitor C3 may be supplied as a DC voltage having a predetermined level to loads, e.g., as operating voltages to the elements of the operation performer 200.

The PFC converter 350 may supply such a converted DC third voltage as the operating voltage to, for example, the display 210 or the like operation performer 200.

The controller 360 (refer to FIG. 6) may output the control signal to the switching devices M1, M2, M3 and M4 of the switch 320 and control the switching devices M1, M2, M3 and M4 to perform switching to thereby output the second AC voltage boosted by the transformer 330. Here, the controller 360 may get feedback on the output voltage of the second rectifier 340 and change a duty or operating frequency of a signal applied to the switching devices M1, M2, M3 and M4.

For example, the controller 360 may get feedback on, e.g., detect the second AC voltage rectified as the output voltage of the second rectifier 340, and control the second AC voltage, which is output based on the detection result, to be constant. Here, the controller 360 may detect average voltage or peak voltage of the second AC voltage, and output the control signal to make the average voltage or the peak voltage constant.

According to an embodiment, the controller 360 may change one of the duty or operating frequency of the control signal applied to the switch 320 according to the levels, e.g., magnitudes of the input first AC voltage, and control the switching operation of the switching devices M1, M2, M3 and M4. In this regard, more detailed descriptions will be made below with reference to FIGS. 4 to 12.

In the display apparatus 10 according to an embodiment of the disclosure, the power supply 100 may employ a transformer based on various circuit topologies, which can generate a high frequency pulse through chopping and perform a resonant operation. For example, the transformer may be embodied in the form of a resonant half-bridge converter or resonant full-bridge converter, as an LLC resonant converter excellent in operating characteristics with regard to variation in loads.

According to an embodiment, the switch 120 may change into one of the full-bridge or the half-bridge based on the switching devices M1, M2, M3 and M4 being selectively turned on/off.

According to an embodiment, when the power supply 100, as shown in FIG. 3, includes the switch 320 including the switching devices M1, M2, M3 and M4 to perform on/off switching operations, and the transformer 330 transferring voltage from the primary side to the secondary side based on the switching operations, the power supply 100 is embodied to operate in one of a high voltage mode or a low voltage mode based on the levels/ranges of the input voltage, e.g., the first AC voltage (e.g., the first voltage).

According to an embodiment, the controller 360 may include a microcomputer for detecting the level of the first voltage and controlling the power supply 100 to operate based on the detected level.

Figure 4:
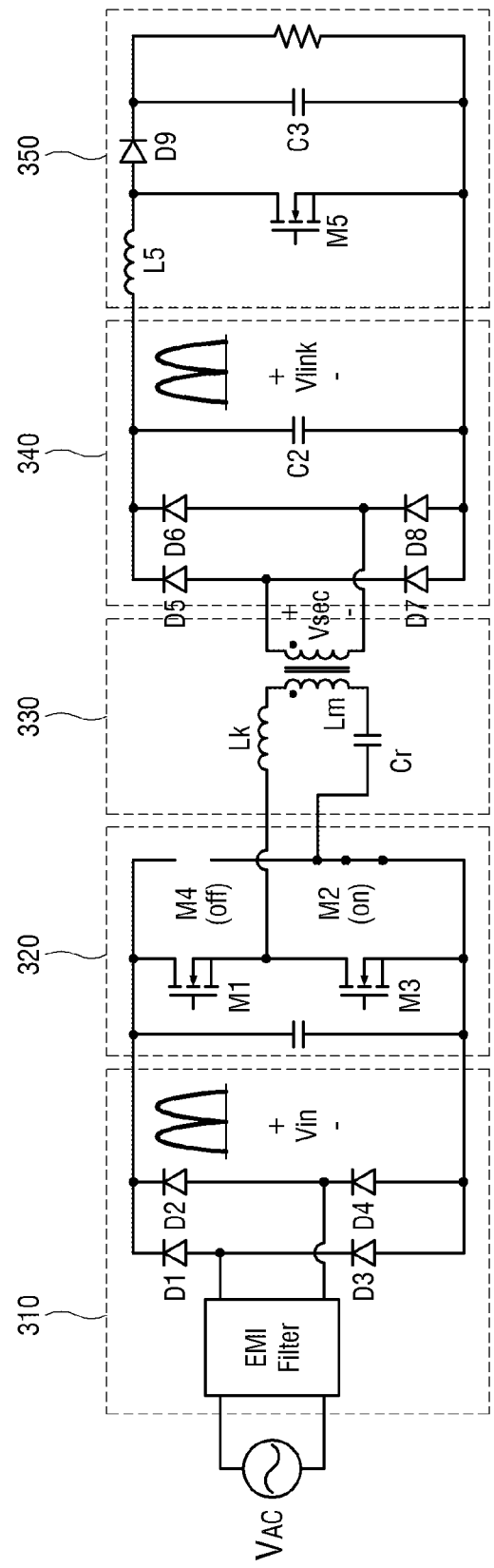
FIG. 4 is a circuit diagram illustrating an example of the power supply of FIG. 3 operating in a high voltage mode according to various embodiments.
Figure 5:
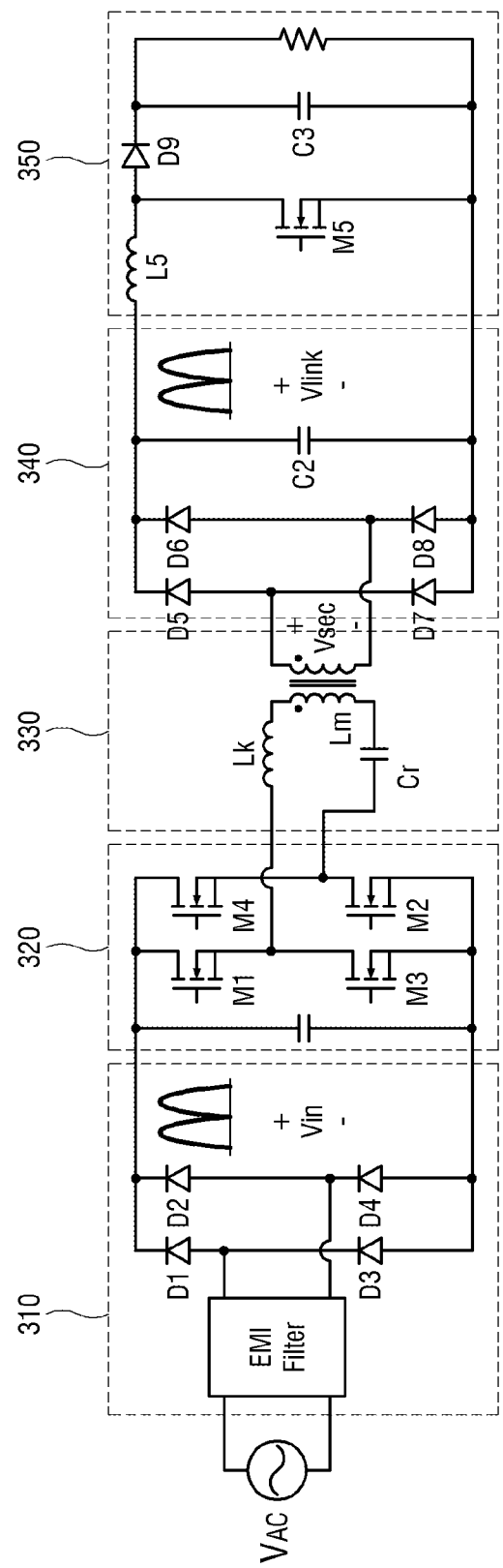
FIG. 5 is a circuit diagram illustrating an example of the power supply of FIG. 3 operating in a low voltage mode according to various embodiments.

FIG. 4 is a circuit diagram illustrating an example of the power supply of FIG. 3 operating in the high voltage mode according to various embodiments, and FIG. 5 is a circuit diagram illustrating an example of the power supply of FIG. 3 operating in the low voltage mode according to various embodiments.

According to an embodiment, the LLC resonant converter including the switch 320 and the transformer 330 may operate in the high voltage mode of FIG. 4 when the input first AC voltage is greater than or equal to a preset (e.g., specified) first reference voltage, and may operate in the low voltage mode of FIG. 5 when the first AC voltage is less than the preset (e.g., specified) first reference voltage. The first reference voltage may be set to, for example, $180V_{rms}$, but not limited thereto.

In the high voltage mode, the LLC resonant converter operates as a half-bridge LLC resonant converter by fast switching on/off the first and third switching devices M1 and M3 in the state that the second switching device M2 is being turned on and the fourth switching device M4 is being turned off as shown in FIG. 4. The switching devices M1 and M3 are complementarily operated, and the operating frequency is changed based on the control signal from the controller 360, thereby performing the switching.

In the low voltage mode, the LLC resonant converter operates as a full-bridge LLC resonant converter, which has an input/output voltage gain twice as high as the half-bridge LLC resonant converter of FIG. 4, by fast switching on/off all the switching devices M1, M2, M3 and M4 as shown in FIG. 5. The first and second switching devices M1 and M2 are complementarily operated, the third and fourth switching devices M3 and M4 are complementarily operated, and the first to fourth switching devices M1, M2, M3 and M4 are switched on and off as varied in the operating frequency or duty based on the control signal from the controller 360.

According to an embodiment, the full-bridge LLC resonant converter operating in the low voltage mode may operate in a low voltage pulse width modulation (PWM) mode when the input first AC voltage is greater than or equal to a preset second reference voltage, and may operate in a low voltage pulse frequency modulation (PFM) mode when the first AC voltage is less than the preset second reference voltage. The second reference voltage may be set to, for example, $132V_{rms}$, but not limited thereto. In the low voltage PWM mode, the pulse width may be controlled by, for example, controlling the duty of the control signal applied to the switching devices M1, M2, M3 and M4, or shifting the phase.

Figure 6:
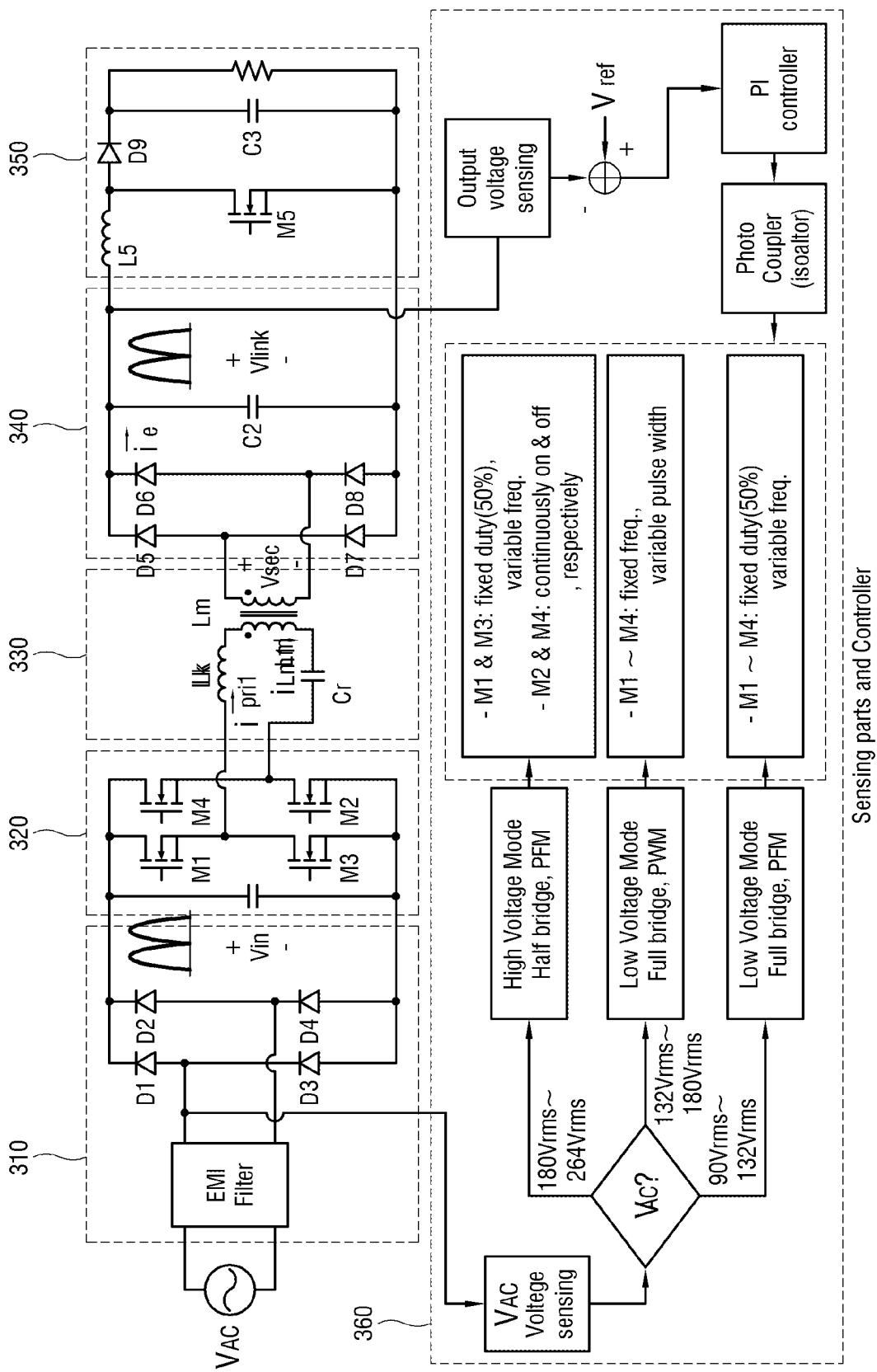
FIG. 6 is a diagram illustrating example operation modes according to ranges of input voltage in the power supply of FIG. 3 according to various embodiments.
Figure 7:
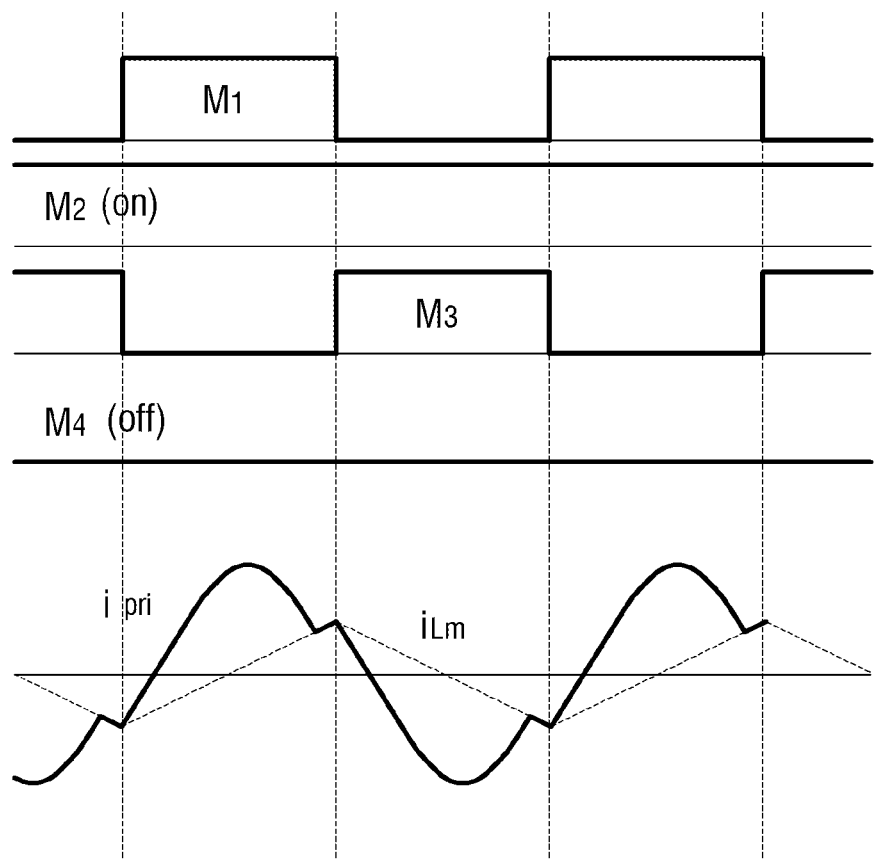
FIG. 7 is a diagram illustrating example waveforms according to operations of a power circuit in a high voltage mode according to various embodiments.
Figure 8:
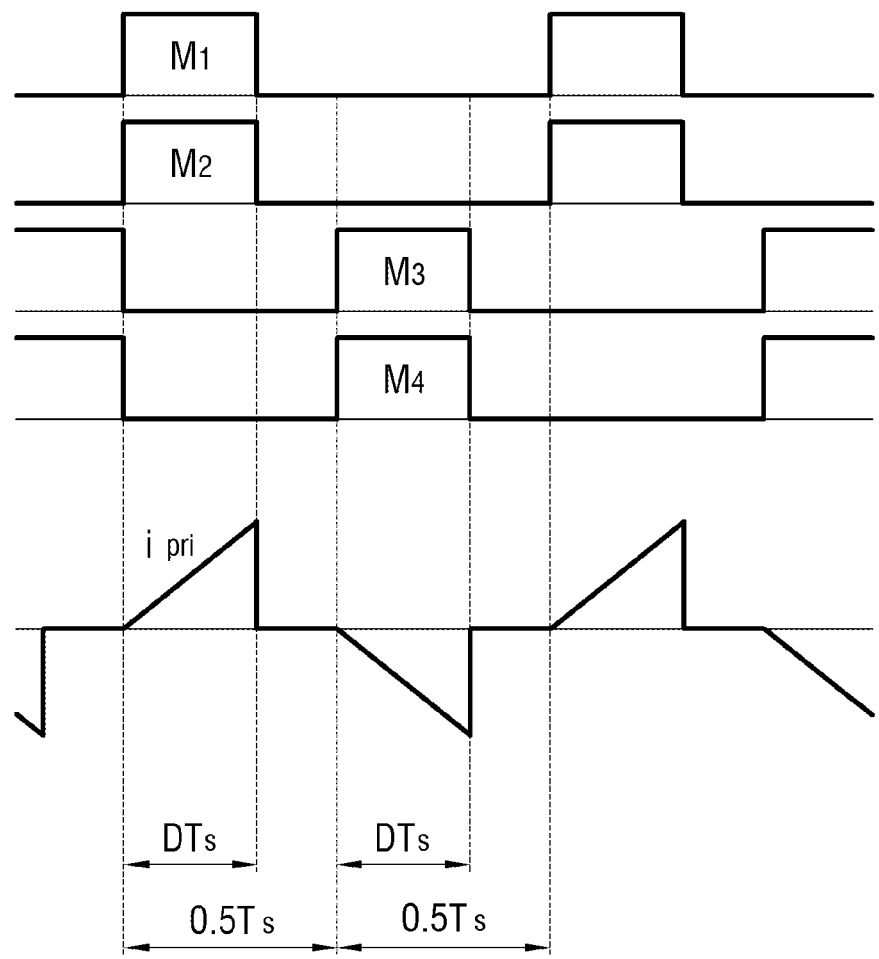
FIG. 8 is a diagram illustrating example waveforms when a power circuit operates by a duty control type in a low voltage pulse width modulation (PWM) mode according to various embodiments.
Figure 9:
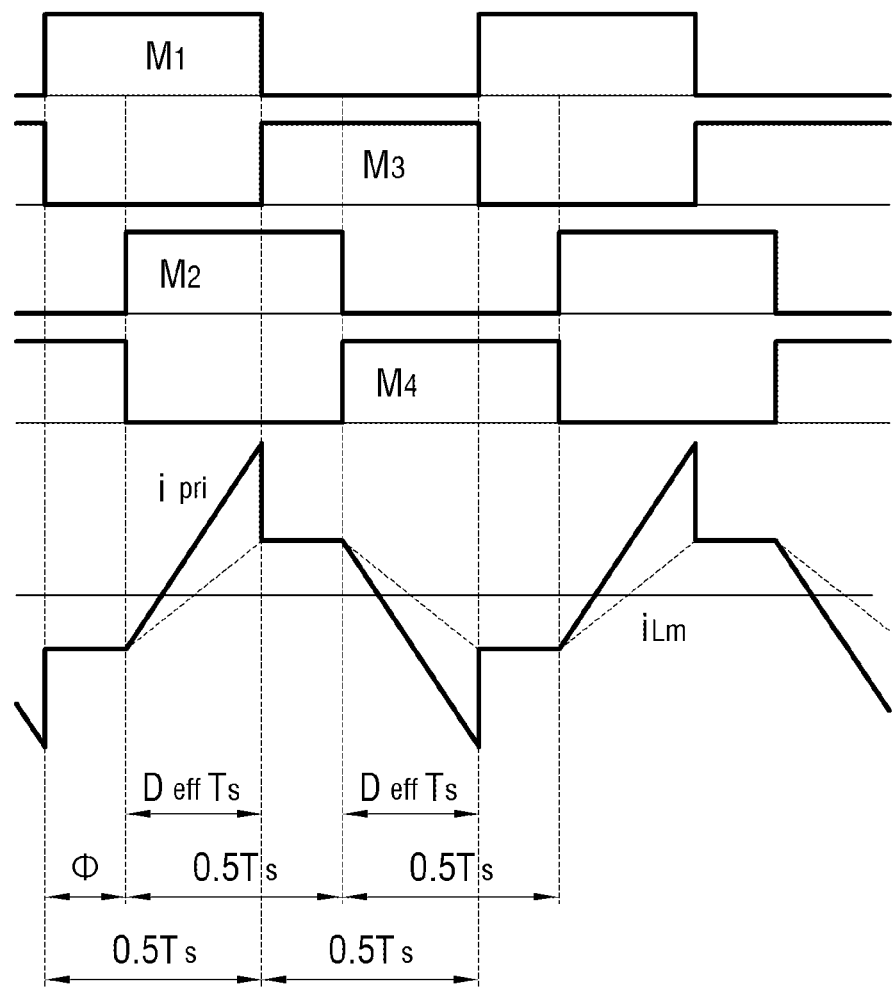
FIG. 9 is a diagram illustrating example waveforms when a power circuit operates by a phase shift type in the low voltage PWM mode according to various embodiments.
Figure 10:
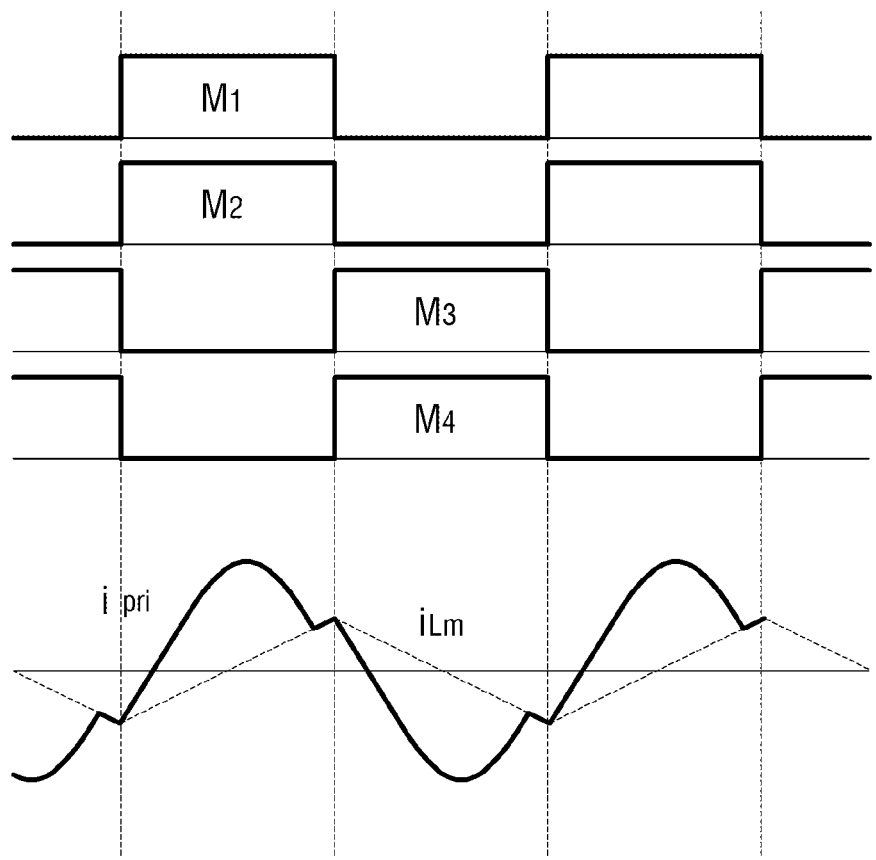
FIG. 10 is a diagram illustrating example waveforms when a power circuit operates in a low voltage pulse frequency modulation (PFM) mode according to various embodiments.
Figure 11:
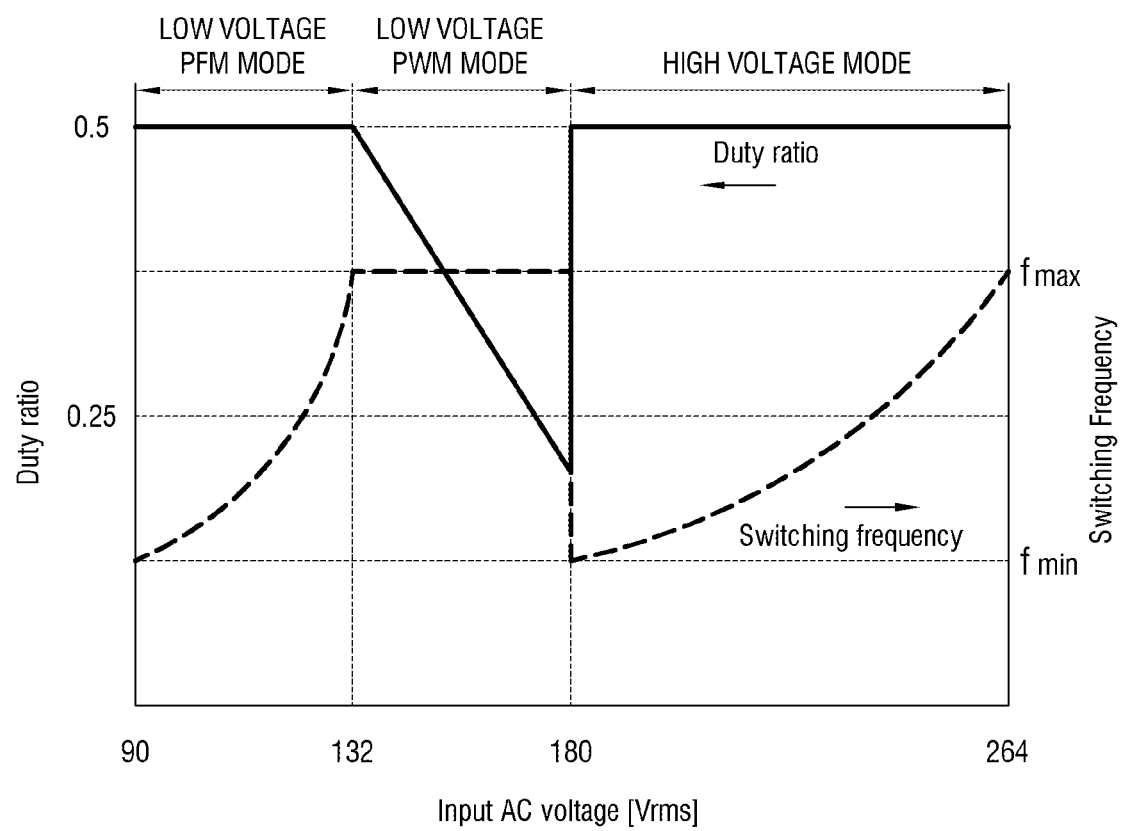
FIG. 11 is a diagram illustrating example waveforms of operation modes according to ranges of input voltage according to various embodiments.

FIG. 6 is a diagram illustrating example operation modes according to ranges of input voltage in the power supply of FIG. 3 according to various embodiments, FIG. 7 is a diagram illustrating example waveforms according to operations of a power circuit in the high voltage mode according to various embodiments, FIG. 8 is a diagram illustrating example waveforms when the power circuit operates by a duty control type in the low voltage PWM mode according to various embodiments, FIG. 9 is a diagram illustrating example waveforms when the power circuit operates by a phase shift type in the low voltage PWM mode according to various embodiments, FIG. 10 is a diagram illustrating example waveforms when the power circuit operates in the low voltage PFM mode, and FIG. 11 is a diagram illustrating example waveforms of operation modes according to ranges of input voltage according to various embodiments.

As shown in FIG. 6, the power supply 100 including the LLC resonant converter, which can operate in the half-bridge or the full-bridge as the switching devices M1, M2, M3 and M4 are selectively turned on/off, receives the input voltage, e.g., the first AC voltage $V_{AC}$ within a predetermined range, for example, 90~264$V_{rms}$.

The controller 360 detects the level of the first AC voltage $V_{AC}$ from the first rectifier 310, and controls the switching devices M1, M2, M3 and M4 to be selectively switched on/off based on the detection result, thereby making the LLC resonant converter operate in the mode corresponding to the input voltage.

For example, as shown in FIGS. 6 and 11, when the level of the input first AC voltage $V_{AC}$ is within a range of 180~264 $V_{rms}$, the controller 360 switches on the switching device M2 and switches off the switching device M4 as shown in FIG. 4.

The controller 360 performs the fast switching by modulating a frequency of a control signal, e.g., a switch gate signal applied to the switching devices M1 and M3 in the state that M2 is being switched on and M4 is being switched off as shown in FIG. 7, thereby controlling the transformer 330 to output the boosted second AC voltage. As shown in FIG. 11, the control signal applied to the switching devices M1 and M3, which perform the switching, has an invariable duty of 50%. Therefore, the LLC resonant converter operates in the high voltage mode (e.g., in the high voltage & PFM mode).

Further, as shown in FIGS. 6 and 11, when the level of the input first AC voltage $V_{AC}$ is in a range of 132~180 $V_{rms}$, the controller 360 performs the fast switching by changing (or shifting) the operating duty or phase of the control signal, e.g., the switch gate signal applied to the switching devices M1, M2, M3 and M4 as shown in FIGS. 8 and 9, thereby controlling the transformer 330 to output the boosted second AC voltage. Here, as shown in FIG. 11, the frequency of the control signal applied to the switching devices M1, M2, M3 and M4, which perform the switching, is invariable. Therefore, the LLC resonant converter operates in the low voltage PWM mode.

According to an embodiment, in the case of a duty-control type low voltage PWM mode where the operating duty is variable as shown in FIG. 8, the duty decreases as the output voltage becomes higher. On the other hand, in the case of a phase-shift type low voltage PWM mode where the phase is shifted as shown in FIG. 9, the phase increases as the output voltage becomes higher, thereby decreasing an effective duty $D_{eff}$. In such example embodiments, zero-voltage switching is ensured throughout the whole input range and the whole load range.

Further, as shown in FIGS. 6 and 11, when the level of the input first AC voltage $V_{AC}$ is in a range of 90~132$V_{rms}$, the controller 360 performs the fast switching by modulating the operating frequency of the control signal applied to the switching devices M1, M2, M3 and M4 as shown in FIGS. 10 and 11, thereby controlling the transformer 330 to output the boosted second AC voltage. Here, as shown in FIG. 11, the control signal applied to the switching devices M1, M2, M3 and M4, which perform the switching, has an invariable duty of 50%. Therefore, the LLC resonant converter operates in the low voltage PFM mode.

Figure 12:
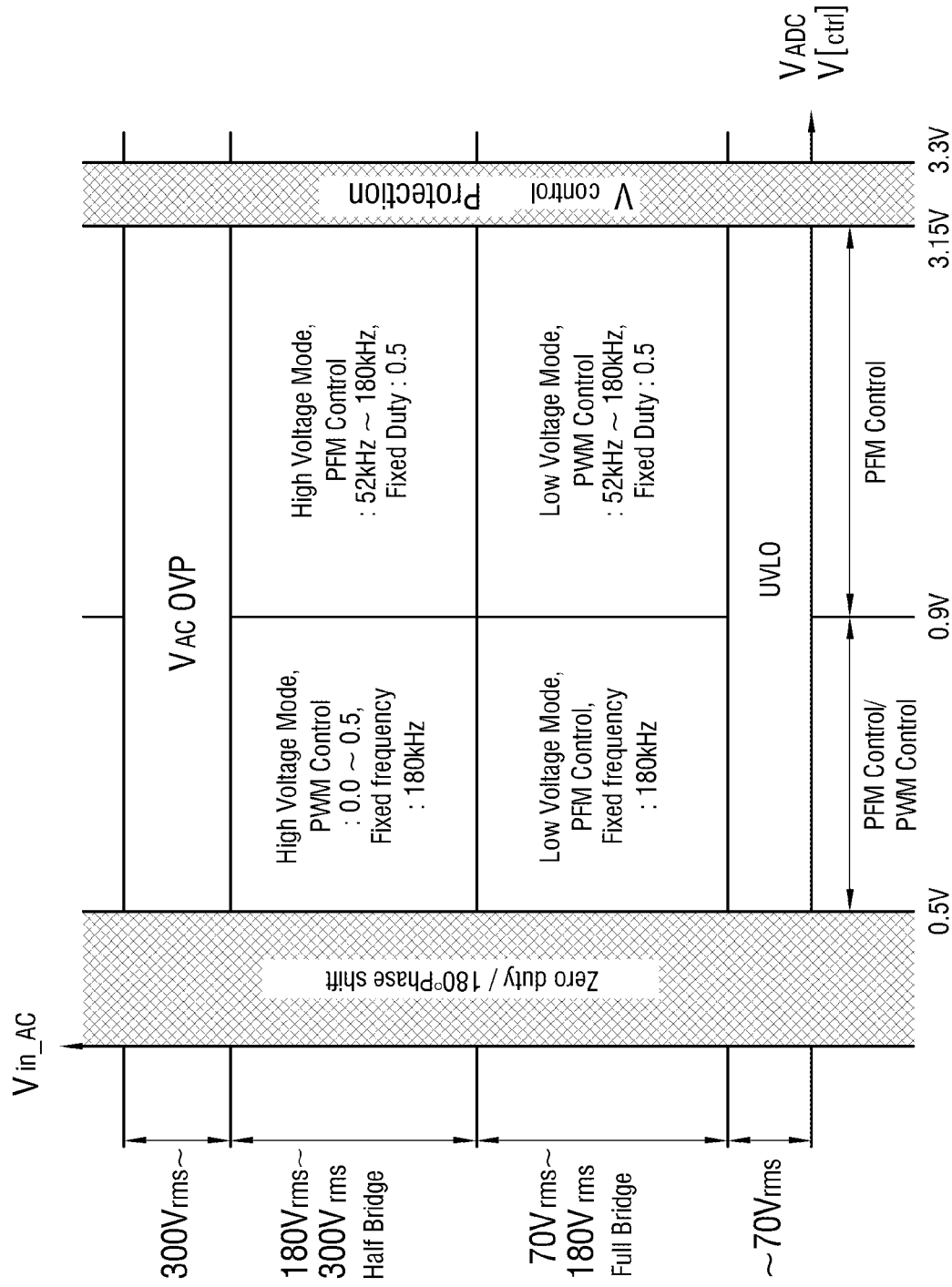
FIG. 12 is a diagram illustrating example operation modes according to ranges of input voltage in a display apparatus according to various embodiments.

FIG. 12 is a diagram illustrating example operation modes according to ranges of input voltage in a display apparatus according to various embodiments.

In the display apparatus 10 according to an embodiment of the disclosure, as shown in FIG. 12, the power supply 100 embodied by the LLC resonant converter operates in the high voltage mode of the full bridge within a high voltage range (e.g., 180~300 $V_{rms}$), and operates in the low voltage mode of the half bridge within a low voltage range (e.g., 70~180 $V_{rms}$) according to the ranges of the input first AC voltage.

In this case, in a low voltage mode based on PWM control, a switching frequency is fixed to the maximum frequency $f_{max}$ (for example, 180 kHz), but a phase is gradually decreased as a control voltage $V_{ctrl}$ increases, thereby increasing an effective duty and thus gradually increasing an output voltage.

Further, in a low voltage mode based on PFM control and a high voltage mode based on PFM control, the switching frequency is gradually decreased while maintaining a fixed duty ratio (for example, '0.5') as the control voltage $V_{ctrl}$ increases. When the control voltage reaches the highest level, the switching frequency has the minimum frequency $f_{min}$ (for example, 52 kHz), thereby gradually increasing the output voltage.

According to an embodiment, the controller 360 controls the LLC resonant converter to operate in the mode corresponding to the level/range of the first DC voltage input as described above. For example, the controller 360 gets feedback on, e.g., detects the second AC voltage rectified in the second rectifier 340 as the output voltage, and controls the output second AC voltage, which is output based on the detection result, to be constant.

Therefore, it is possible to not only operate in modes corresponding to input AC power having various levels, but also maintain the constant level of the output voltage.

According to an embodiment, when the display apparatus 10 is a TV, the power supply 100 may generally operate based on the PFM control. In other words, referring to FIG. 12, the ranges of the low voltage mode and the high voltage mode, which are based on the PFM control of 52 kHz-180 kHz at a fixed duty of '0.5', may correspond to the actual operation range of the display apparatus 10.

The display apparatus 10 according to an embodiment of the disclosure makes the power supply 100, to which the resonant converter including the switch 320 and the high voltage transformer 330 operating based on the PFM control using a variable switching frequency as described above is applied, perform jittering for EMI improvement. Below, detailed example of performing the jittering will be described with reference to the drawings.

Figure 13:
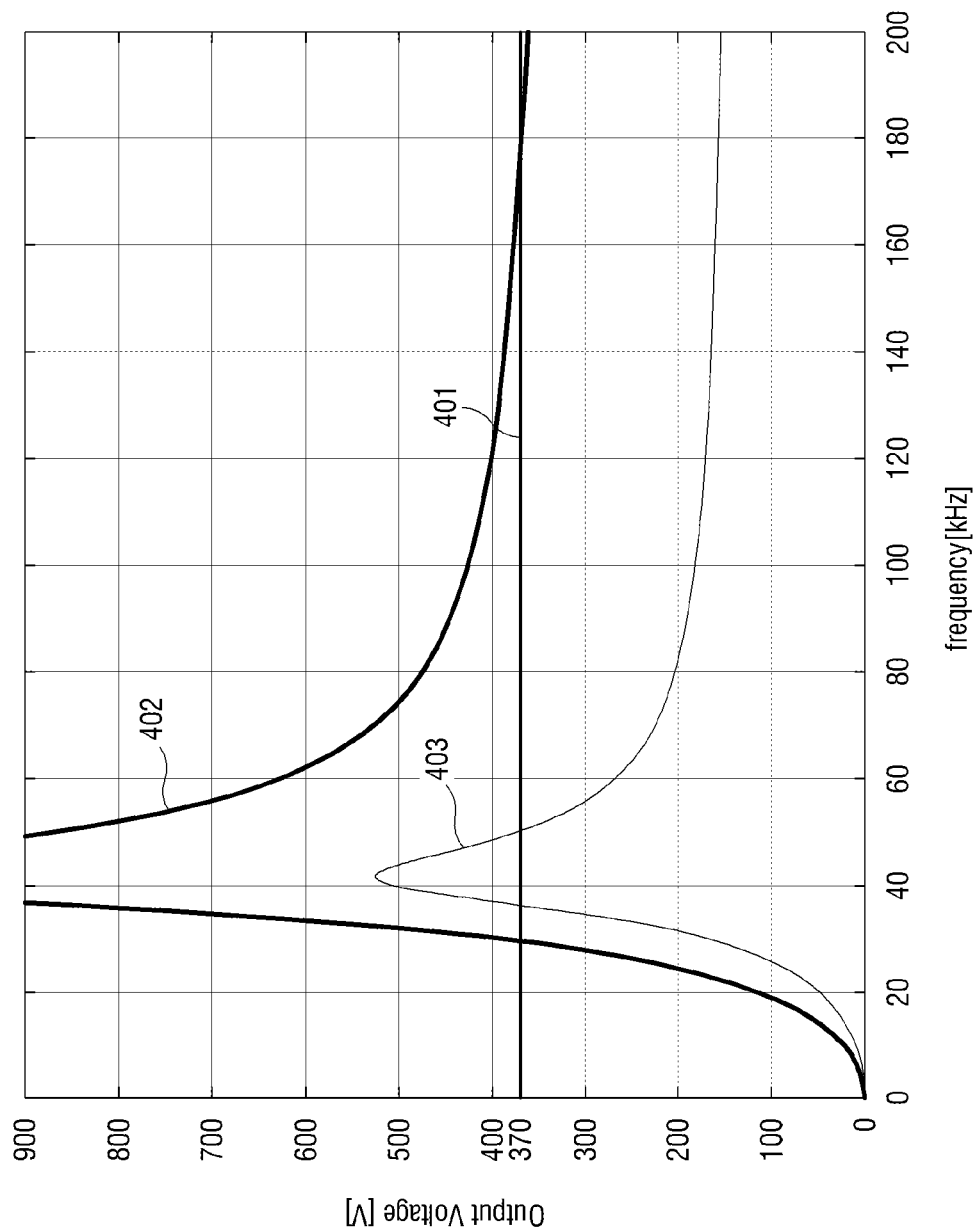
FIG. 13 is a graph illustrating an output voltage gain based on a variable switching frequency in a display apparatus according to various embodiments.

FIG. 13 is a graph illustrating an output voltage gain based on a variable switching frequency in a display apparatus according to various embodiments.

The resonant converter may, as shown in FIG. 13, be characterized in that the output voltage is varied depending on modulation of the switching frequency.

FIG. 13 illustrates an output voltage 402 varied depending on the switching frequency in case of an input voltage $V_{in}$ of 180$V_{rms}$ and an output voltage 403 varied depending on the switching frequency in case of an input voltage $V_{in}$ of 77V$_{rms}$ on the assumption that a required output voltage 401 is 370V, of which respective operating conditions are as follows.

402: P$_o$ 850 W, V$_{in}$ 180V$_{rms}$, L$_m$ 70 μH, Lr 13.5 μH, Cr 174 nF

403: P$_o$ 850 W, V$_{in}$ 77V$_{rms}$, L$_n$ 70 μH, Lr 13.5 μH, Cr 174 nF

As above, due to the resonant converter characterized in that the output voltage is varied depending on the frequency, the voltage gain may not be kept constant in the operation mode based on the PFM control where the switching frequency is modulated. For example, while a rectified input AC voltage (e.g., first AC voltage) of 100 Hz/120 Hz is converted through the switch 320 and the transformer 330, the voltage gain is varied depending on the modulation of the switching frequency, e.g., the operating frequency within one period of the input AC voltage (100 Hz/120 Hz), and therefore the output AC voltage may be distorted without having a normal waveform of the AC voltage.

Therefore, in the display apparatus 10 according to an embodiment of the disclosure, the power supply 100 may perform the jittering by increasing or decreasing the frequencies of the control signals applied to the switching devices of the switch 320 within a predetermined (e.g., specified) range so as to synchronize with the AC period of the input first AC voltage, thereby preventing and/or avoiding the foregoing distorted waveform.

Figure 14:
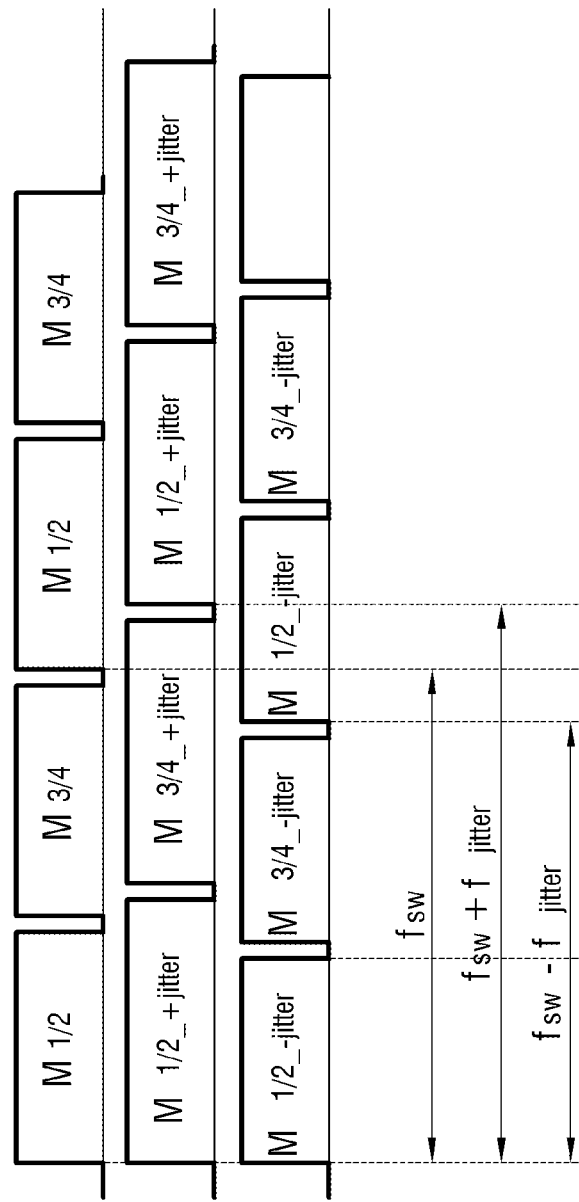
FIG. 14 is a diagram illustrating example jittering by which a frequency is increased/decreased in a display apparatus according to various embodiments.

FIG. 14 is a diagram illustrating example jittering by which a frequency is increased/decreased in a display apparatus according to various embodiments.

According to an embodiment, the controller 360 of the power supply 100 may synchronize with the AC period of the input voltage (e.g., the first power), and output control signals to the switching devices of the switch 320 so that the switching frequency f$_{SW}$ can be increased (+jitter)(f$_{sw}$+f$_{jitter}$) or decreased (−jitter)(f$_{sw}$−f$_{jitter}$) within a predetermined (e.g., specified) range for one synchronized period.

For example, as shown in FIG. 14, the controller 360 may generate and output (1) a control signal having a frequency f$_{sw}$ in a normal case of giving no jitter, (2) a control signal having a frequency f$_{sw}$+f$_{jitter}$ in a case of giving jitter to increase the switching frequency, and (3) a control signal having a frequency f$_{sw}$−f$_{jitter}$ in a case of giving jitter to decrease the switching frequency.

According to an embodiment, when the power supply 100 operates in the high voltage mode as shown in FIG. 4 and FIG. 7, the controller 360 may output the control signals, increased or decreased in frequency, to the switching devices M1 and M3.

According to an embodiment, when the power supply 100 operates in the low voltage PFM mode as shown in FIG. 5 and FIG. 10, the controller 360 may output the control signals, increased or decreased in frequency, to the switching devices M1, M2, M3 and M4.

Below, the jittering performed synchronizing with the period of the input voltage according to embodiments of the disclosure will be described in greater detail with reference to the accompanying drawings.

Figure 15:
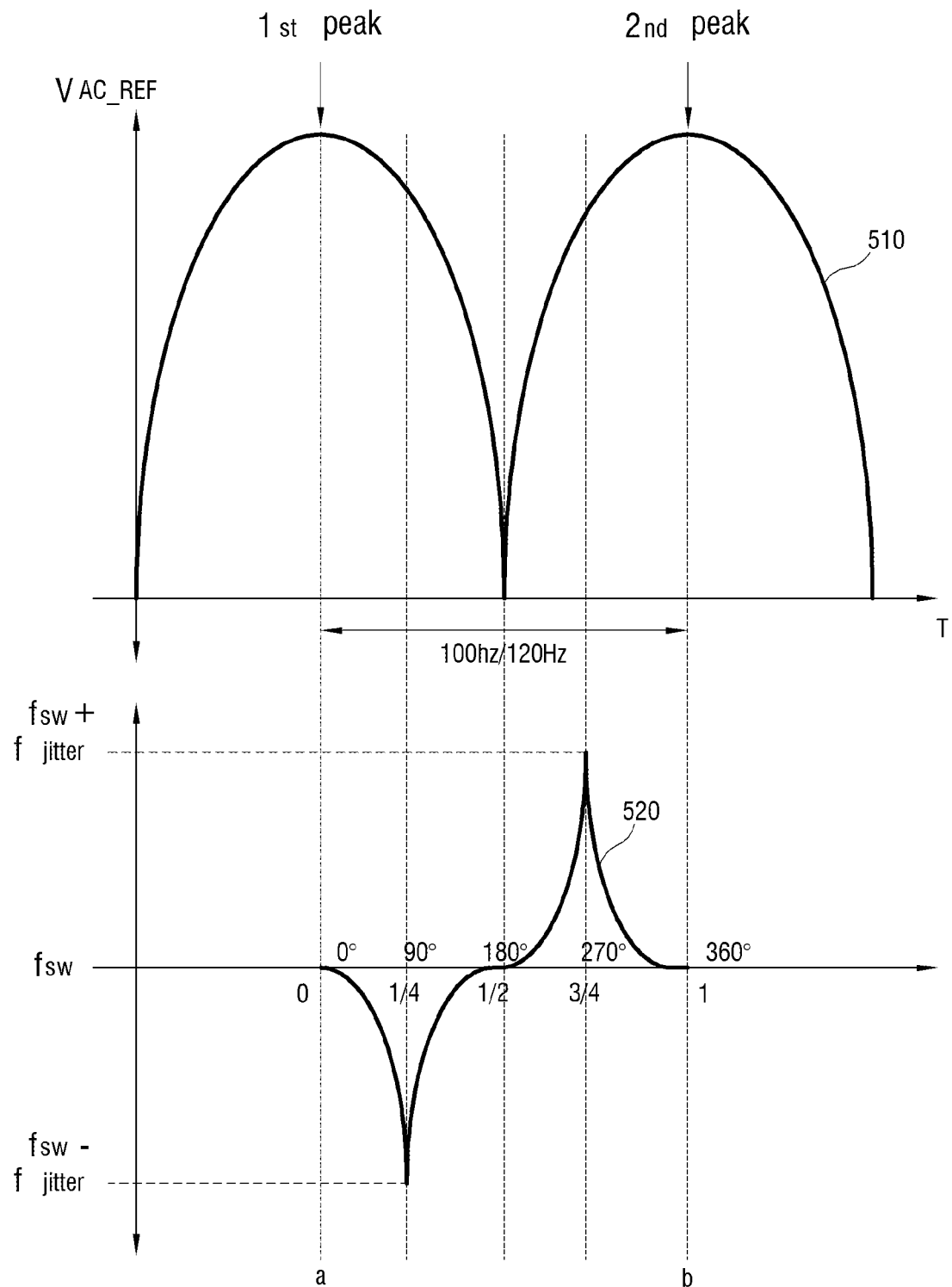
FIG. 15 is a graph illustrating an example of performing synchronous jittering in a display apparatus according to various embodiments.
Figure 16:
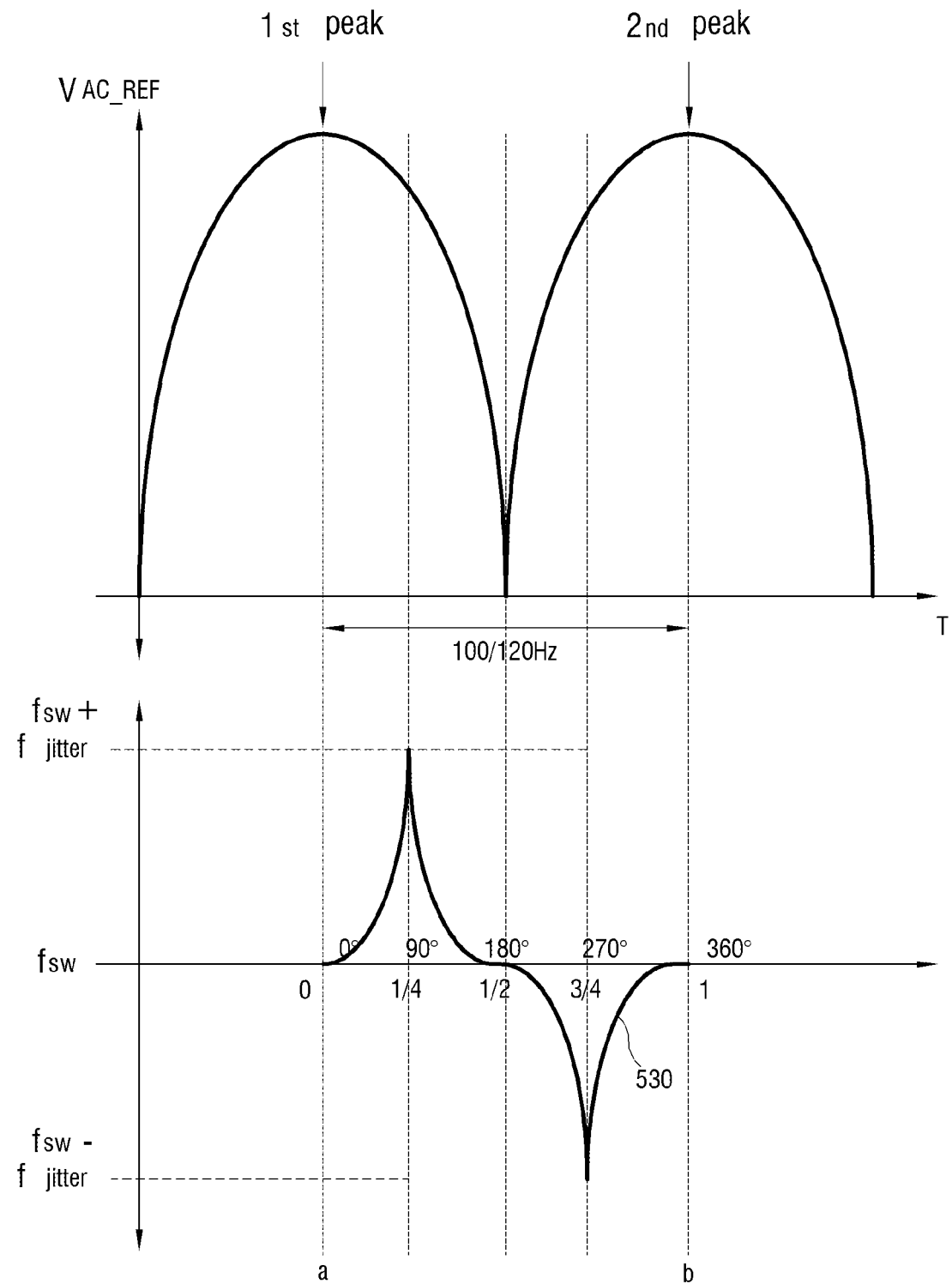
FIG. 16 is a graph illustrating another example of performing synchronous jittering in a display apparatus according to various embodiments.

FIG. 15 is a graph illustrating an example of performing synchronous jittering in a display apparatus according to various embodiments, and FIG. 16 is a graph illustrating another example of performing synchronous jittering in a display apparatus according to various embodiments.

FIGS. 15 and 16 illustrate the jittering in the power supply 100, in which the switch 320 and the transformer 330 are embodied by the LLC resonant AC/AC converter as described with reference to FIGS. 3 to 12, by way of example, but the jittering performed synchronizing with the AC period of the input voltage according to the disclosure may for example be applied to various transformer-circuit topologies for controlling the output voltage based on frequency modulation, such as LC series resonance, LLC resonance, LC parallel resonance, etc.

According to an embodiment, as described with reference to FIGS. 3 to 12, the resonant converter including the switch 320 and the transformer 330 may operate based on the PFM control, so that the transformer 330 can raise the input first AC voltage into the second voltage based on the frequency modulation of the control signals applied to the switching devices of the switch 320, in the high voltage mode or the low voltage PFM mode.

The controller 360 may modulate the frequency of the control signal to make the second voltage have a predetermined (e.g., specified) target level, and perform the jittering for increasing or decreasing the frequency of the control signal within a predetermined (e.g., specified) range to synchronize with the AC period of the first voltage.

According to an embodiment, the controller 360 may sort, e.g., divide one period (e.g., AC period) of the control signal synchronizing with the AC period of the input voltage (e.g., the first voltage) into a plurality of sections in predetermined units, for example, in units of ¼ period as shown in FIGS. 15 and 16, and control the switching frequency f$_{sw}$ to be increased (+jitter)(f$_{sw}$+f$_{jitter}$) or decreased (−jitter)(f$_{sw}$−f$_{jitter}$) within a predetermined (e.g., specified) range for each of the divided sections (quarter periods). The division unit for the control signal is not limited to the ¼ period.

According to an embodiment, the controller 360 may generate a control signal for increasing or decreasing the frequencies corresponding to the phases for each of the divided sections of the AC period.

For instance, with regard to the control signal synchronizing with the input AC voltage (e.g., the first voltage), the controller 360 may output a control signal to the jittering is applied so that the frequency can be gradually increased in the section of 0~90° from the start one period to ¼ period; gradually decreased in the section of 90~180° from ¼ period to 2/4 period; gradually increased in the section of 180~270° from 2/4 period to ¾ period; and gradually decreased in the section of 270~360° from ¾ period to the end (e.g., 4/4 period) of one period.

Thus, the increasing or decreasing circulation of the frequency is made within one period of the control signal, and the number of times the increase of decrease of the frequency is circulated within the one period is not limited to one time.

In other words, the frequency may be increased or decreased two or more times within the one period. In this case, a unit section for increasing or decreasing the frequency may be a predetermined section of ⅛ or smaller.

Further, according to an embodiment, one section of the increasing/decreasing circulation may synchronize with not only one AC period but also two or more AC periods.

According to an embodiment, the controller 360 may identify the highest level, e.g., the peak of the input AC voltage, e.g., the first voltage, and identify the AC period of the first voltage based on a point in time when the highest level is identified.

For example, as shown in FIGS. 15 and 16, the controller 360 identifies the 1$^{st}$ peak and 2$^{nd}$ peak of the input AC voltage, in other words, the first voltage 510, and identifies time from the point 'a' of the 1$^{st}$ peak to the point 'b' of the 2$^{nd}$ peak as one AC period of the first voltage 510.

Therefore, the controller 360 may, as shown in FIG. 15, output a control signal, in which start and end points of jittering for increasing or decreasing a control signal 520 output to the switch 320 within a predetermined range synchronize with the points 'a' and 'b', e.g., one period of the first voltage, to the switch 320.

According to an embodiment, the controller 360 applies the jittering to the frequency to synchronize with the AC period of the first voltage 510 as described above, in which the frequency is increased or decreased within a predetermined range for the purpose of efficient improvement in EMI while maintaining control stability of an output voltage.

Figure 17:
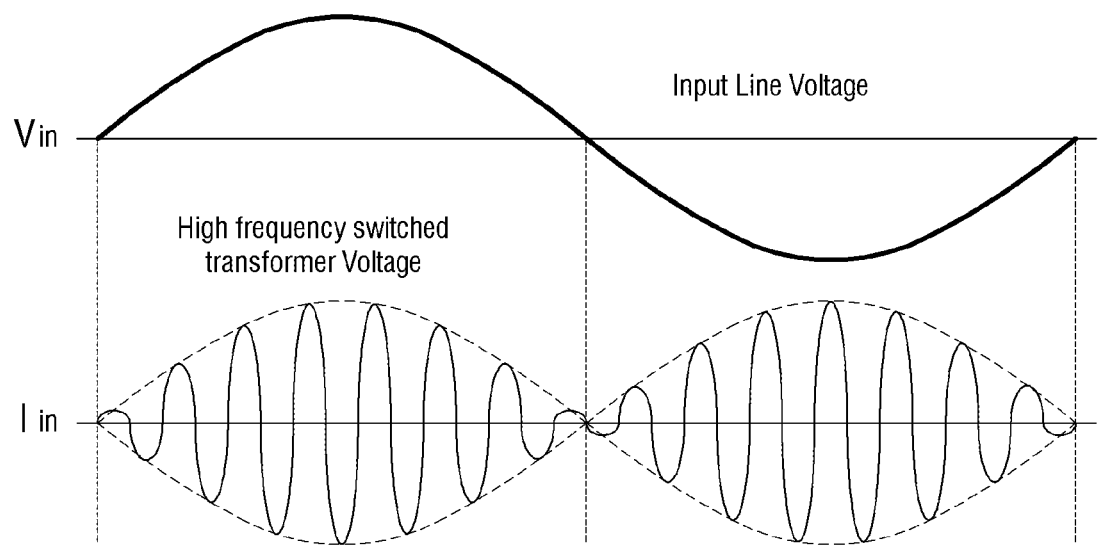
FIG. 17 is a graph illustrating an example relationship between an input AC voltage and a resonant inductor current in a power supply of a display apparatus according to various embodiments.

FIG. 17 is a diagram illustrating an example relationship between an input AC voltage and a resonant inductor current in a power supply of a display apparatus according to various embodiments.

In the power supply 100 to which the resonant converter of FIG. 3 is applied, the resonant inductor current (e.g., input current) $I_{in}$ is, as shown in FIG. 17, relatively largely varied in a section where an input voltage $V_{in}$ is high, but relatively small varied in a section where the input voltage $V_{in}$ is low. Here, the larger the variation in the input current, the greater the effect on the EMI.

Therefore, to maximize and/or increase the improvement in the EMI, the variation in the switching frequency may be maximized and/or increased in the section where the input current is high, but the control stability of the output AC voltage is lowered because the output voltage is largely varied depending on the variation in the frequency due to the characteristics of the resonant converter. On the other hand, the control stability of the output AC voltage is high but the improvement in the EMI is insignificant when the variation in the switching frequency is maximized and/or increased in the section where the input voltage is low.

Therefore, according to an embodiment of the disclosure, for the purpose of the improvement in the EMI while maintaining the voltage stability, the jittering is performed while continuously increasing and decreasing the switching frequency within a predetermined range during one period of the input AC voltage, e.g., the first voltage.

According to an embodiment, referring to FIG. 15, the controller 360 outputs the control signal 520 having the switching frequency of a steady state, to which the jittering is not applied, at the point 'a' corresponding to the 1st peak at which the input AC voltage, e.g., the first voltage $V_{AC\_REF}$ 510 has the highest level (e.g., the highest input voltage) ($f_{sw\_operation}=f_{sw}=f_{sw\_steady\_state}$).

During the ½ period in which the first voltage $V_{AC\_REF}$ 510 is gradually dropped from the highest level and reaches the lowest level, the controller 360 increases and decreases the frequency of the control signal 520 within a predetermined (e.g., specified) range $f_{jitter}$.

For example, the controller 360, as shown in FIG. 15, gradually decreases (−jitter) the frequency of the control signal 520 during the section of 0~90° from the start point 'a' of the AC period, at which the jittering starts, to the ¼ period, thereby outputting the control signal 520, of which the switching frequency is decreased by a predetermined (e.g., specified) level compared to that of the steady state at the ¼ period (e.g., at 90°) ($f_{sw\_operation}=f_{sw}-f_{jitter}$). The decrease in the frequency at the ¼ period may correspond to a predetermined (e.g., specified) range set for performing the jittering.

The controller 360 gradually increases (+jitter) the frequency of the control signal 520 during the section of 90~180° from the ¼ period to the ½ period, thereby outputting the control signal 520 having the switching frequency of the steady state to which the jittering is not applied at the ½ period (e.g., at 180°) ($f_{sw\_operation}=f_{sw}=f_{sw\_steady\_state}$).

During the section from the ½ period to the point 'b' of the $2^{nd}$ peak, in which the first voltage $V_{AC\_REF}$ 510 is gradually boosted from the lowest level and reaches the highest level, the controller 360 increases and decreases the frequency of the control signal 520 within a predetermined range $f_{jitter}$.

For example, the controller 360, as shown in FIG. 15, gradually increases (+jitter) the frequency of the control signal 520 during the section of 180~270° from the ½ period to the ¾ period, thereby outputting the control signal 520, of which the switching frequency is increased by a predetermined level compared to that of the steady state at the ¾ period (e.g., at 270°) ($f_{sw\_operation}=f_{sw}+f_{jitter}$). The increase in the frequency at the ¾ period may correspond to a predetermined range set for performing the jittering.

The controller 360 gradually decreases (−jitter) the frequency of the control signal 520 during the section of 270~360° from the ¾ period to the end point 'b' of the AC period, thereby outputting the control signal 520 having the switching frequency of the steady state, to which the jittering is not applied, at the point 'b' (e.g., at 360°) corresponding to the $2^{nd}$ peak at which the input AC voltage, e.g., the first voltage $V_{AC\_REF}$ 510 has the highest level (e.g., the highest input voltage) ($f_{sw\_operation}=f_{sw}=f_{sw\_steady\_state}$).

FIG. 15 illustrates an example embodiment in which the switching frequency is increased or decreased within a predetermined (e.g., specified) range, within which the frequency is decreased from the start point to the ¼ period, increased from the ¼ period to the ¾ period, and decreased from the ¾ period to the end point, but the increased/decreased in the frequency according to the disclosure is not limited to the embodiment shown in FIG. 15.

Referring to FIG. 16, the controller 360 outputs a control signal 530 having the switching frequency of the steady state, to which the jittering is not applied, at the point 'a' corresponding to the $1^{st}$ peak at which the input AC voltage, e.g., the first voltage $V_{AC\_REF}$ 510 has the highest level (e.g., the highest input voltage) ($f_{sw\_operation}=f_{sw}=f_{sw\_steady\_state}$).

During the ½ period in which the first voltage $V_{AC\_REF}$ 510 is gradually dropped from the highest level and reaches the lowest level, the controller 360 increases and decreases the frequency of the control signal 530 within a predetermined (e.g., specified) range $f_{jitter}$.

For example, the controller 360, as shown in FIG. 16, gradually increases (+jitter) the frequency of the control signal 530 during the section of 0~90° from the start point 'a' of the AC period, at which the jittering starts, to the ¼ period, thereby outputting the control signal 530, of which the switching frequency is increased by a predetermined (e.g., specified) level compared to that of the steady state at the ¼ period (e.g., at 90°) ($f_{sw\_operation}=f_{sw}+f_{jitter}$). The increase in the frequency at the ¼ period may correspond to a predetermined (e.g., specified) range set for performing the jittering.

The controller 360 gradually decreases (−jitter) the frequency of the control signal 530 during the section of 90~180° from the ¼ period to the ½ period, thereby outputting the control signal 530 having the switching frequency of the steady state to which the jittering is not applied at the ½ period (e.g., at 180°) ($f_{sw\_operation}=f_{sw}=f_{sw\_steady\_state}$).

During the section from the ½ period to the point 'b' of the 2nd peak, in which the first voltage $V_{AC\_REF}$ 510 is gradually boosted from the lowest level and reaches the highest level, the controller 360 increases and decreases the frequency of the control signal 530 within a predetermined (e.g., specified) range $f_{jitter}$.

For example, the controller 360, as shown in FIG. 16, gradually decreases (−jitter) the frequency of the control signal 530 during the section of 180~270° from the ½ period to the ¾ period, thereby outputting the control signal 530, of which the switching frequency is decreased by a predetermined (e.g., specified) level compared to that of the steady state at the ¾ period (e.g., at 270°) $f_{sw\_operation}=f_{sw}-f_{jitter}$. The decrease in the frequency at the ¾ period may correspond to a predetermined range set for performing the jittering.

The controller 360 gradually increases (+jitter) the frequency of the control signal 530 during the section of 270~360° from the ¾ period to the end point 'b' of the AC period, thereby outputting the control signal 530 having the switching frequency of the steady state, to which the jittering is not applied, at the point 'b' corresponding to the $2^{nd}$ peak at which the input AC voltage, e.g., the first voltage $V_{AC\_REF}$ 510 has the highest level (e.g., the highest input voltage) ($f_{sw\_operation}=f_{sw}=f_{sw\_steady\_state}$).

The switching devices of the switch 320 receives the control signal, of which the frequency is increased and decreased within a predetermined (e.g., specified) range while synchronizing with the AC period of the first voltage as described above, from the controller 360, and performs the on/off switching operations based on the received control signal, thereby outputting the boosted second voltage from primary side from the secondary side of the transformer 330.

Figure 18:
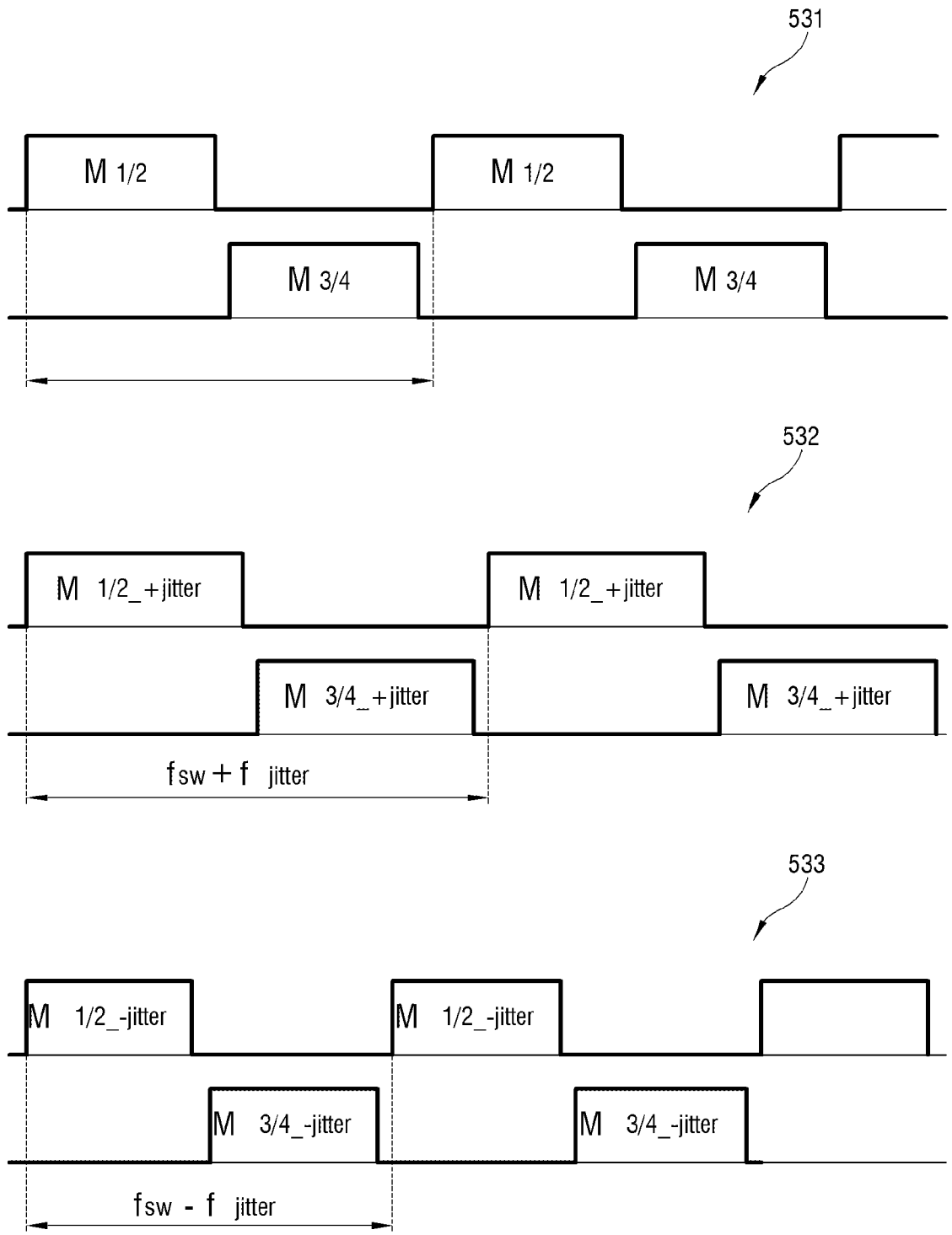
FIG. 18 is a diagram illustrating example operations of a switching device based on synchronous jittering in a display apparatus according to various embodiments.

PPM FIG. 18 is a diagram illustrating an example of operations of a switching device based on synchronous jittering in a display apparatus according to various embodiments.

According to an embodiment, when the power supply 100 operates in the high voltage mode as shown in FIGS. 4 and 7, the controller 360 may output the control signal, to which the jittering is applied by increasing or decreasing the frequency within a predetermined (e.g., specified) range through the switching devices M1 and M3.

For example, according to the embodiment of FIG. 16, the control signal 530 having the frequency $f_{sw}$ of the steady state, in which the frequency is not increased/decreased, is output to the switching devices M1 and M3 at the point 'a' corresponding to the $1^{st}$ peak where the input AC voltage, e.g., the first voltage $V_{AC\_REF}$ 510 has the highest level (e.g., the highest input voltage), so that the two switching devices M1 and M3 can be complementarily/alternately turned on and off as shown in '531' of FIG. 18, thereby transmitting power from the primary side to the secondary side of the transformer 330 ($f_{sw\_operation}=f_{sw}=f_{sw\_steady\_state}$).

As shown in FIG. 16, the frequency of the control signal 530 is gradually increased during the section from the start point 'a' of the AC period to the ¼ period, and the control signal 530 of $f_{jitter}$ in which the frequency is increased by '$f_{jitter}$' compared to that of the steady state, is output to the switching devices M1 and M3 at the ¼ period, so that the two switching devices M1 and M3 can be complementarily/alternately turned on and off as shown in '532' of FIG. 18, thereby transmitting power from the primary side to the secondary side of the transformer 330 ($f_{sw\_operation}=f_{sw}+f_{jitter}$).

As shown in FIG. 16, the frequency of the control signal 530 is gradually decreased during the section from the ¼ period to the ½ period, and the control signal 530 having the frequency $f_{sw}$ of the steady state is output to the switching devices M1 and M3 at the ½ period, so that the two switching devices M1 and M3 can be complementarily/alternately turned on and off as shown in '531' of FIG. 18, thereby transmitting power from the primary side to the secondary side of the transformer 330 ($f_{sw\_operation}=f_{sw}=f_{sw\_steady\_state}$).

As shown in FIG. 16, the frequency of the control signal 530 is continuously decreased during the section from the ½ period to the ¾ period, and the control signal 530 of '$f_{sw}-f_{jitter}$', in which the frequency is decreased by '$f_{jitter}$' compared to that of the steady state, is output to the switching devices M1 and M3 at the ¾ period, so that the two switching devices M1 and M3 can be complementarily/alternately turned on and off as shown in '533' of FIG. 18, thereby transmitting power from the primary side to the secondary side of the transformer 330 ($f_{sw\_operation}=f_{sw}-f_{jitter}$).

As shown in FIG. 16, the frequency of the control signal 530 is gradually increased during the section from the ¼ period to the end point 'b' of the AC period, and the control signal 530 recovered to the steady state having the frequency $f_{sw}$ at the point 'b' corresponding to the $2^{nd}$ peak, at which the input AC voltage, e.g., the first voltage $V_{AC\_REF}$ 510 has the highest level (e.g., the highest input voltage), is output to the switching devices M1 and M3, so that the two switching devices M1 and M3 can be complementarily/alternately turned on and off as shown in '533' of FIG. 18, thereby transmitting power from the primary side to the secondary side of the transformer 330 ($f_{sw\_operation}=f_{sw}=f_{sw\_steady\_state}$).

FIG. 18 illustrates an example in which the switching operation based on the PFM control to which the synchronous jittering is applied is performed in the high voltage mode in which the switching operation is performed by the switching devices M1 and M3, but the synchronous jittering according to the disclosure is not limited to the high voltage mode as shown in FIG. 18. Therefore, the synchronous jittering may be applied to various power supplies including the switching device and the transformer to form the resonant converter. For example, the switching devices M1, M2, M3 and M4 of the switch 320 in the low voltage PFM mode as described with reference to FIGS. 5, 6 and 10 receive the control signals, of which the switching frequencies are increased or decreased for each of the unit sections, and perform the synchronous switching operations based on the received control signals, thereby transmitting power from the primary side to the secondary side of the transformer 330.

FIGS. 15 and 16 illustrate examples in which the frequency of the control signal is increased and decreased within a predetermined (e.g., specified) range while synchronizing with the AC period of the first voltage. In these embodiments, the control signal is sectioned in units of ¼ period, and increased or decreased in frequency according to the corresponding sections. However, the unit of the section during which the frequency is increased or decreased according to the disclosure is not limited to the ¼ period of FIGS. 15 and 16. For example, the controller 360 may control the control signal synchronizing with the AC period of the first voltage to be sectioned in units of ⅛ period and increased or decreased in frequency according to the corresponding sections.

In the foregoing power supply 100 of the display apparatus 10 according to various example embodiments of the disclosure, the controller 360 may adjust the voltage of the control signal to thereby output the control signal increased or decreased in frequency.

Figure 19:
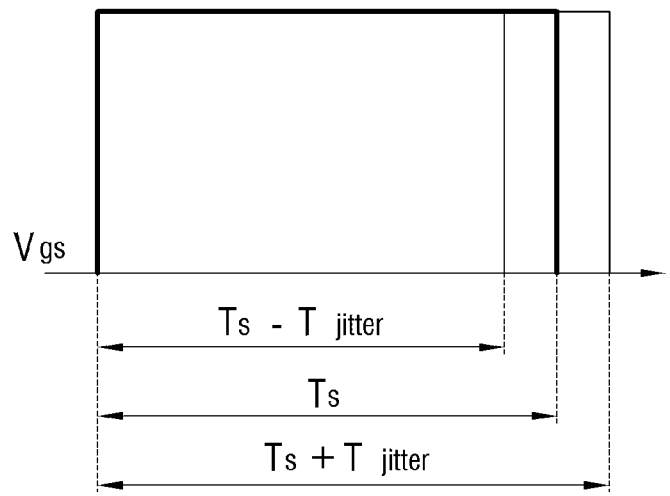
FIG. 19 is a diagram illustrating an example relationship between a switching frequency and voltage of a control signal in a power supply of a display apparatus according to various embodiments.
Figure 19:
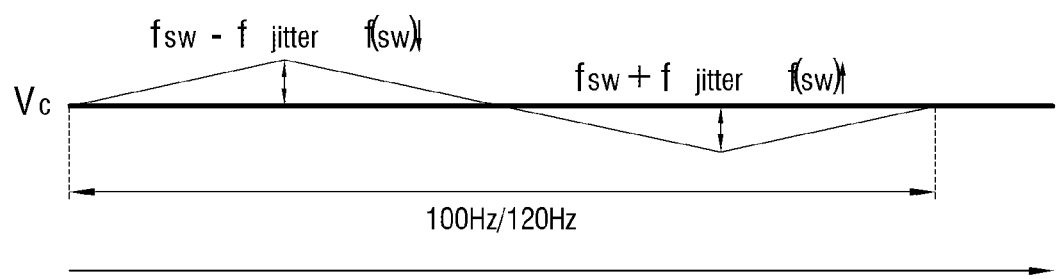

FIG. 19 is a diagram illustrating an example relationship between a switching frequency and voltage of a control signal in a power supply of a display apparatus according to various embodiments.

According to an embodiment, in the power supply 100 to which the resonant converter of FIG. 3 is applied, the switching frequency may be varied depending on the magnitudes, e.g., levels of the voltage Vgs of the control signal 520, 530 to be applied to the switching devices.

As shown in FIG. 19, when the control voltage has a reference level (or a reference control level) $V_c$ in the steady state to which the jittering is not applied, the frequency decreases when the control voltage is boosted but the switching frequency increases when the control voltage is dropped in the power supply 100 operating based on the PFM control.

Therefore, the controller 360 may perform the jittering by adjusting the voltage of the control signal 520, 530. For example, the controller 360 may perform the jittering by changing the switching frequency in such a manner that a predetermined (e.g., specified) control voltage is added to or subtracted from the reference voltage $V_c$ of the control signal 520, 530. According to an embodiment of the disclosure in which the synchronous jittering is carried out, the average voltage of the control signal 520, 530 of one period, to and from which the control voltage is added or subtracted, may be used as the reference voltage $V_c$.

Below, examples, in which a period of an input voltage is identified and an increasing/decreasing range of a frequency is identified while the synchronous jittering is performed according to the disclosure, will be described in greater detail with reference to the accompanying drawings.

In the display apparatus 10 according to an embodiment, the controller 360 of the power supply 100 detects the input AC voltage, e.g., the first voltage, identifies the highest level of the first voltage, and generates the control signal to synchronize with the AC period of the first voltage based on the identified highest level, thereby carrying out the synchronous jittering. Further, the jitter frequency corresponding to the increase/decrease of the frequency for the jittering may synchronize with the frequency of the input AC voltage.

Figure 20:
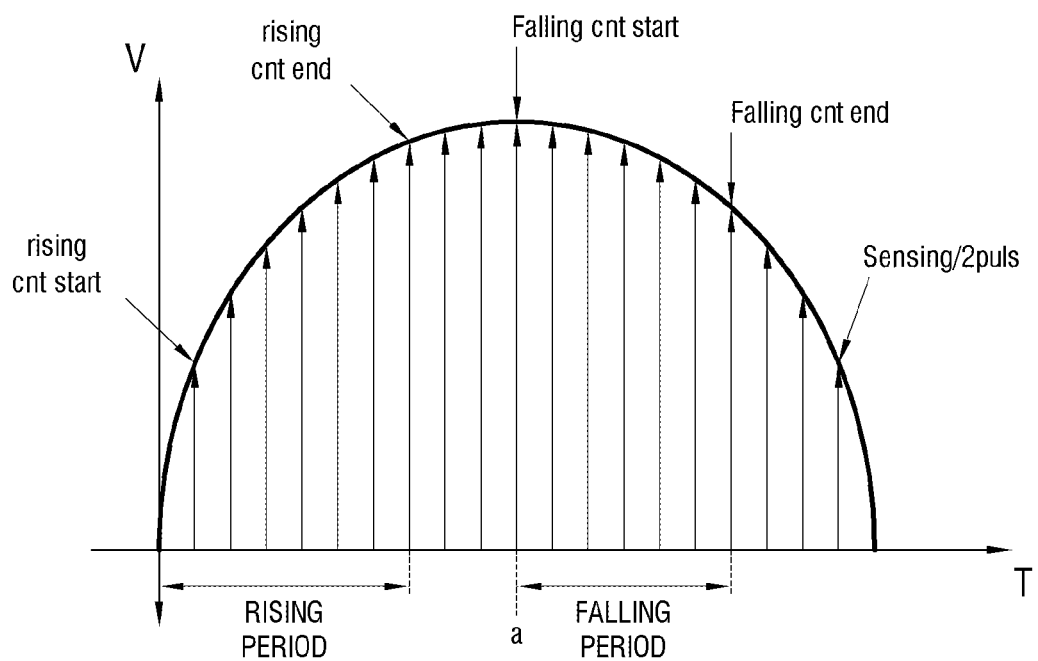
FIG. 20 is a graph illustrating an example of identifying the highest level of an input voltage in a display apparatus according to various embodiments.
Figure 21:
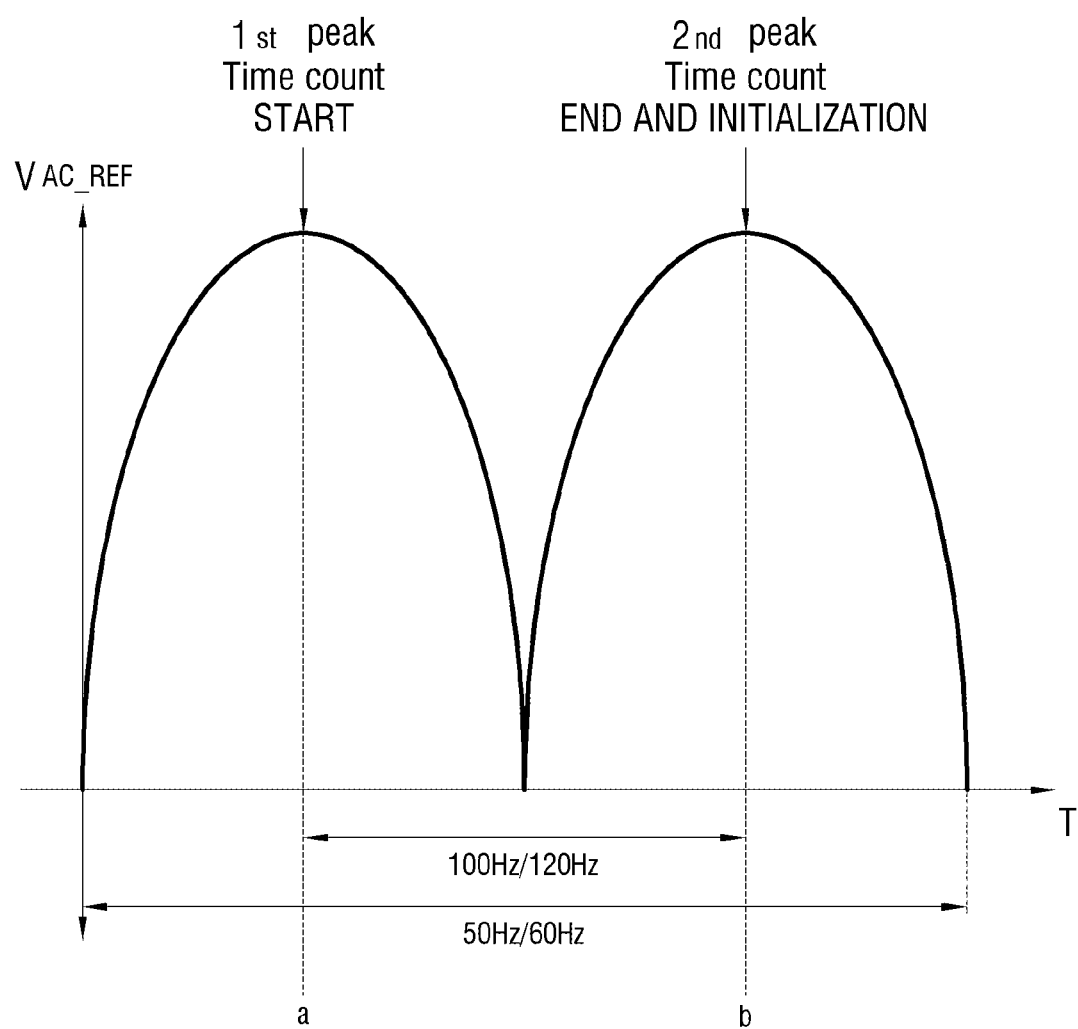
FIG. 21 is a graph illustrating an example of identifying a frequency of input voltage for jittering in a display apparatus according to various embodiments.
Figure 22:
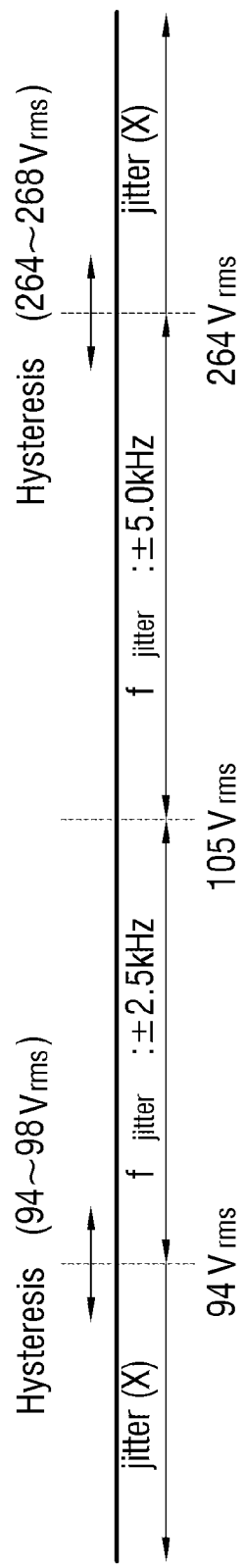
FIG. 22 is a diagram illustrating an example of adjusting a jitter frequency based on input voltage in a display apparatus according to various embodiments.

FIG. 20 is a graph illustrating an example of identifying the highest value of input voltage in a display apparatus according to various embodiments, FIG. 21 is a graph illustrating an example of identifying a frequency of input voltage for jittering in a display apparatus according to various embodiments, and FIG. 22 is a diagram illustrating an example of adjusting a jitter frequency based on input voltage in a display apparatus according to various embodiments.

According to an embodiment, the controller 360 may detect the voltage level of the input AC voltage, e.g., the first voltage at predetermined (e.g., specified) time intervals during two periods of the first voltage. The detected first voltage may be the AC voltage rectified through the first rectifier 310, and the rectified first voltage may have a frequency (e.g., line frequency) twice as high as the input commercial AC voltage.

The controller 360 identifies/distinguishes the rising period and falling period of the first voltage, based on the detected first voltage.

For example, the controller 360 calculates an average level (e.g., a first average level) between a first detected level and a second detected level, and calculates an average level (e.g., a second average level) between the second detected level and a third detected level, among a plurality of voltage levels, e.g., detected levels obtained by detecting the voltage levels of the input AC voltage (e.g., the first voltage) at predetermined (e.g., specified) time intervals. The controller 360 compares the calculated first and second average levels, and distinguishes between the rising period and falling period of the first voltage based on the comparison results. The controller 360 may repetitively perform the calculation of the average levels and the comparison between the two average levels as described above with regard to the detected levels.

According to an embodiment, based on the results of comparing the average levels, the controller 360 may identify a section of the first voltage as the rising period (rising count) when the voltage level is kept rising for a predetermined (e.g., specified) number of times corresponding to the section (for example, 30 times), and identify a section of the first voltage as the falling period (falling count) when the voltage level is kept falling for a predetermined number of times corresponding to the section (for example, 20 times).

The controller 360 may identify the first detected level, at which the rising period is switched over to the falling period, as the highest voltage (peak). Further, a section from the point (point 'a'), at which the first highest voltage is identified, to the point (point 'b'), at which the second highest voltage is identified, is regarded as one period of the input voltage.

Time needed for identifying the rising period is $1/f_{sw}*2*$ (rising count), and time needed for identifying the falling period is $1/f_{sw}*2*$(falling count). Therefore, the number of times the periods are identified may be less than or equal to a quarter period of the input first voltage (commercial AC voltage).

There are regional differences in the line frequency of the commercial AC voltage. For example, the commercial AC voltage may have the line frequency of 50 Hz or 60 Hz according to the regions. Therefore, the rectified AC voltage (e.g., the first voltage) may have the line frequency of 100 Hz or 120 Hz twice 50 Hz or 60 Hz.

According to an embodiment, the controller 360 may, as shown in FIG. 21, identify the line frequency (60 Hz/50 Hz) of the input commercial AC voltage using a timer in 500 μsec, with respect to the points 'a' and 'b' at which the first and second highest voltages (the $1^{st}$ peak and the $2^{nd}$ peak) of the rectified first voltage $V_{AC\text{-}REC}$. Here, the rectified AC voltage (e.g., the first voltage) has the frequency twice the line frequency of the commercial AC voltage. For example, when a timer value is between '19' (9.5 msec 105 Hz) and '21' (10.5 msec 95 Hz), it is identified that the input voltage has a line frequency of 50 Hz. When a timer value is between '15' (7.5 msec≈133 Hz) and '17' (8.5 msec≈117 Hz), it is identified that the input voltage has a line frequency of 60 Hz.

Further, the controller 360 may identify the jitter frequency $f_{jitter}$ as a predetermined (e.g., specified) range, e.g., a frequency fluctuation, in which the frequency for the jittering is increased or decreased so as to correspond to the identified line frequency. For example, when it is identified that the input voltage has a frequency of 50 Hz, the jitter frequency $f_{jitter}$ of 50 Hz is identified. When it is identified that the input voltage has a frequency of 60 Hz, the jitter frequency $f_{jitter}$ of 60 Hz is identified.

The controller 360 outputs the control signal, in which the jitter frequency $f_{jitter}$ identified as above for each of the sections is added to or subtracted from the switching frequency $f_{sw}$, to the switch 320, so that the switching devices, for example, M1 and M3 in the high voltage mode and M1, M2, M3 and M4 in the low voltage PFM mode can perform switching operations based on the frequency to which the jittering is applied.

According to an embodiment, the jitter frequency $f_{jitter}$ of a predetermined (e.g. specified) range, e.g., a frequency fluctuation may be adjusted according to the levels of the input voltage (AC voltage) of the power supply 100.

The display apparatus 10 may be embodied to receive an input voltage of universal line 90~264 $V_{rms}$ as the commercial AC voltage. However, the range of the input voltage is not limited to this example, but may be variously set according to surrounding environments or conditions, etc.

According to an embodiment, when it is assumed that the resonant converter of the power supply 100 can receive an input voltage of 90 Vrms~264 Vrms and output a constant AC output voltage having the highest voltage of 370 V and a root-mean-square voltage of 260 Vrms, the level of the output voltage tends to more largely vary depending on the change in the switching frequency when the lower input voltage is received, due to the characteristics of this converter.

Therefore, when the level of the input AC voltage is less than a predetermined reference level, the controller 360 may output the control signal, in which the jitter frequency $f_{jitter}$ corresponding to a predetermined range where the frequency is increased or decreased, e.g., a frequency fluctuation is adjusted. Here, the reference level may for example be set to 105 $V_{rms}$, but not limited thereto.

For example, as shown in FIG. 22, when the input AC voltage has the frequency of 50 Hz and is greater than or equal to a predetermined (e.g., specified) reference level, in other words, is within a range of 105 $V_{rms}$ 264 $V_{rms}$, the jitter frequency $f_{jitter}$ corresponding to a predetermined (e.g., specified) range where the frequency is increased/decreased may be set to 50 Hz corresponding to the frequency of the input AC voltage.

On the other hand, when the input AC voltage has the frequency 50 Hz and is less than a predetermined (e.g., specified) reference level, in other words, is within a range of 90 $V_{rms}$~105 $V_{rms}$, the jitter frequency $f_{jitter}$ corresponding to a predetermined (e.g., specified) range where the frequency is increased/decreased may be adjusted into 50 Hz.

Therefore, when the input voltage having a low level causing the output voltage to have small fluctuation based on the jittering is received, the frequency fluctuation of the control signal is adjusted to perform stable jittering, and thus an effect on reducing the EMI is expected in various regions/countries different in the input voltage.

The display apparatus 10 according to an embodiment of the disclosure may be embodied to receive the AC voltage of 90~264 $V_{rms}$, and apply hysteresis to the boundaries (for example, 90 $V_{rms}$ and 264 $V_{rms}$) of the input voltage range for the stable operations. The width of the applied hysteresis may be 4 $V_{rms}$ as shown in FIG. 22, but not limited thereto.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. A display apparatus comprising:
   a display;
   a transformer configured to boost an input alternating current (AC) first voltage and output a second voltage;
   a switch configured to allow an electric current to flow or stop in the transformer based on a control signal;
   a power factor correction (PFC) converter configured to correct a power factor of the output second voltage, and output a direct current (DC) third voltage to the display; and
   a controller, comprising processing circuitry, configured to modulate a frequency of the control signal so that the second voltage has a target level, and increase or decrease the frequency of the control signal within a specified range to synchronize with an AC period of the first voltage,
   wherein the controller is further configured to divide the AC period of the first voltage into a plurality of sections in specified units, and increase and/or decrease the frequency of the control signal for each of the divided sections.

2. The display apparatus according to claim 1, wherein the controller is configured to increase or decrease the frequency of the control signal based on phases for each of the divided sections.

3. The display apparatus according to claim 1, wherein the controller is configured to adjust a voltage of the control signal to correspond to the increase or decrease of the frequency.

4. The display apparatus according to claim 3, wherein the controller is configured to control the control signal, the voltage of which is adjusted, to have a constant average voltage during the AC period of the first voltage.

5. The display apparatus according to claim 1, wherein the controller is configured to identify a frequency of the first voltage, and identify a range, within which the frequency of the control signal is increased or decreased, based on the identified frequency of the first voltage.

6. The display apparatus according to claim 1, wherein the controller is configured to identify the AC period of the first voltage corresponding to a section from a point at which a highest voltage level of the first voltage is first identified to a point at which a highest voltage level is second identified.

7. The display apparatus according to claim 6, wherein the controller is configured to:
   detect a voltage level at specified time intervals for two periods of the first voltage, and identify a rising period and a falling period of the first voltage based on results of the detection; and
   identify the highest voltage level based on a point, at which the rising period is switched over to the falling period.

8. The display apparatus according to claim 7, wherein the controller is configured to:
   calculate a first average level between a first detected level and a second detected level, and calculate a second average level between the second detected level and a third detected level, among the plurality of detected levels; and
   identify a rising period and a falling period of the first voltage based on comparison between the first average level and the second average level.

9. The display apparatus according to claim 7, wherein the controller is configured to adjust the range, within which the frequency of the control signal is increased or decreased, based on the level of the first voltage less than a specified reference level.

10. The display apparatus according to claim 1, wherein the controller is configured to identify the frequency of the input AC first voltage, and identify a range, within which the frequency of the control signal is increased or decreased, based on the identified frequency.

11. The display apparatus according to claim 1, further comprising:
   a first rectifier configured to rectify a voltage received from an outside and output the AC first voltage; and
   a second rectifier configured to rectify the second voltage boosted from the first voltage,
   wherein the controller is configured to detect the rectified second voltage, and modulate the frequency of the control signal so that the second voltage has a target level, based on results of the detection.

12. The display apparatus according to claim 1, wherein the switch comprises first, second, third and fourth switching devices and,
   based on the first, second, third and fourth switching devices being selectively turned on or off, the switch is configured to correspond to one of a full bridge type or a half bridge type to receive a control signal, the frequency of which is increased or decreased within a specified range, from the controller.

13. The display apparatus according to claim 12, wherein the controller is configured to:
   turn on the second switching device and turn off the fourth switching device based on the input AC first voltage greater than or equal to a specified first reference voltage, and
   output the control signal, the frequency of which is increased or decreased, to the first and third switching devices.

14. The display apparatus according to claim 13, wherein the controller is configured to output the control signal, the frequency of which is increased or decreased, to the first, second, third and/or fourth switching devices, based on the input AC first voltage being less than the specified first reference voltage.

* * * * *